United States Patent [19]
Ishizu

[11] Patent Number: 5,661,765
[45] Date of Patent: Aug. 26, 1997

[54] RECEIVER AND TRANSMITTER-RECEIVER

[75] Inventor: Fumio Ishizu, Kanagawa, Japan

[73] Assignee: Mitsubishi Denki Kabushiki Kaisha, Tokyo, Japan

[21] Appl. No.: 460,842

[22] Filed: Jun. 5, 1995

[30] Foreign Application Priority Data

Feb. 8, 1995 [JP] Japan .................... 7-020513

[51] Int. Cl.$^6$ .................................... H03D 3/24
[52] U.S. Cl. .................. 375/376; 329/307; 329/325; 455/255; 455/260
[58] Field of Search ................ 375/375, 373, 375/326, 327; 329/307, 325, 360; 455/84, 85, 86, 87, 113, 255, 257, 258, 259, 260

[56] References Cited

U.S. PATENT DOCUMENTS

| | | | |
|---|---|---|---|
| 3,702,379 | 11/1972 | Peterson et al. | 179/13 |
| 4,847,876 | 7/1989 | Baumbach et al. | 375/113 |
| 4,870,684 | 9/1989 | Arai et al. | 329/325 |
| 4,926,447 | 5/1990 | Corsetto et al. | 375/120 |
| 4,959,844 | 9/1990 | Walp | 329/307 |
| 5,533,059 | 7/1996 | Tsup | 329/307 |

FOREIGN PATENT DOCUMENTS 1-307317  12/1989  Japan .
5-276087  10/1993  Japan .

*Primary Examiner*—Wellington Chin
*Assistant Examiner*—Conguan Tran
*Attorney, Agent, or Firm*—Wolf, Greenfield & Sacks, P.C.

[57] ABSTRACT

A receiver comprises a demodulator for demodulating a received signal, a clock recovery circuit for regenerating a clock phase-synchronized with a symbol clock component included in the received signal and a frequency offset compensating unit for controlling a variable division ratio of a variable divider constituting a phase-controlled loop of the clock recovery circuit so as to compensate for a frequency offset corresponding to a difference between a frequency of the symbol clock component included in the received signal and a free-running frequency of the clock recovery circuit. The receiver is constructed such that the compensation for the frequency offset is performed with operation timing different from that of the clock recovery circuit.

26 Claims, 22 Drawing Sheets

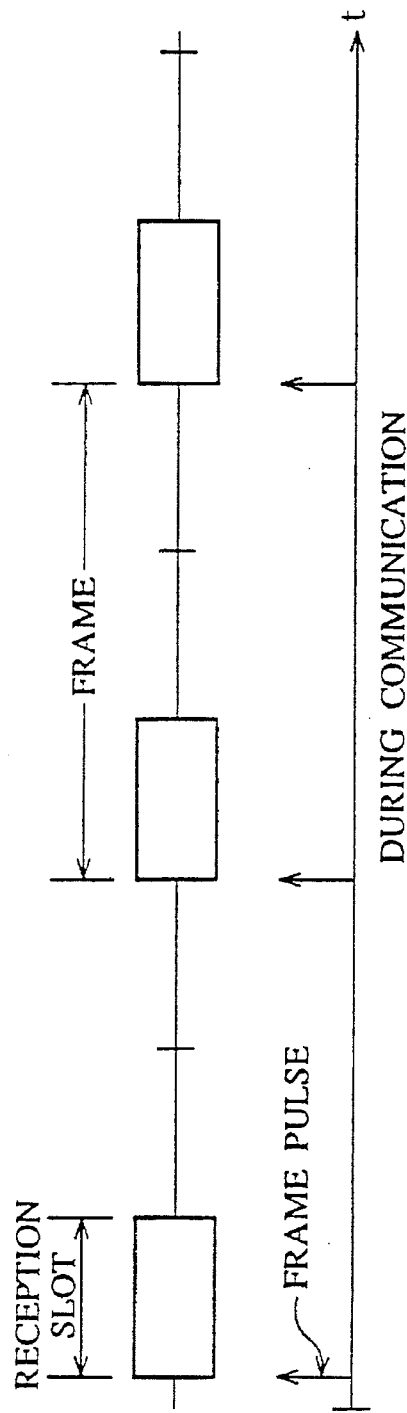
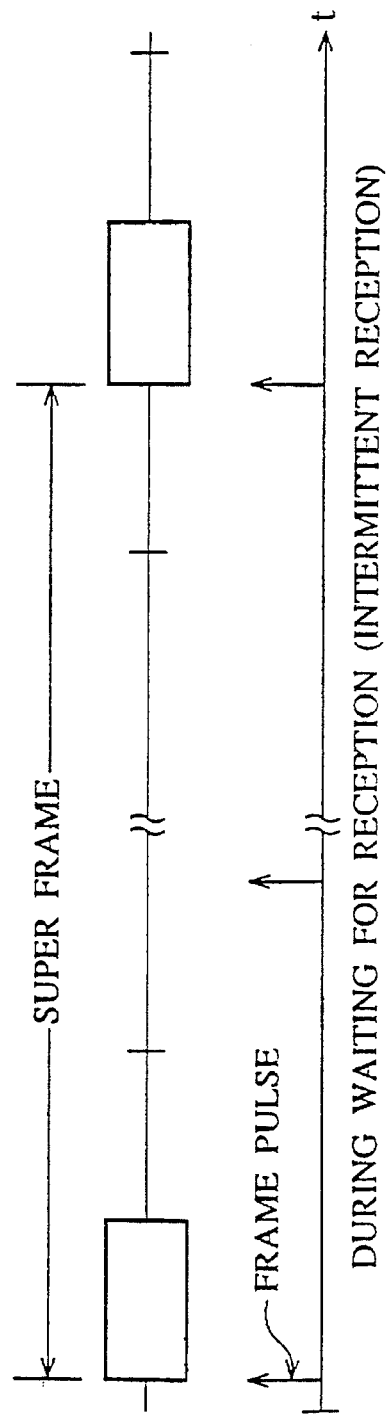

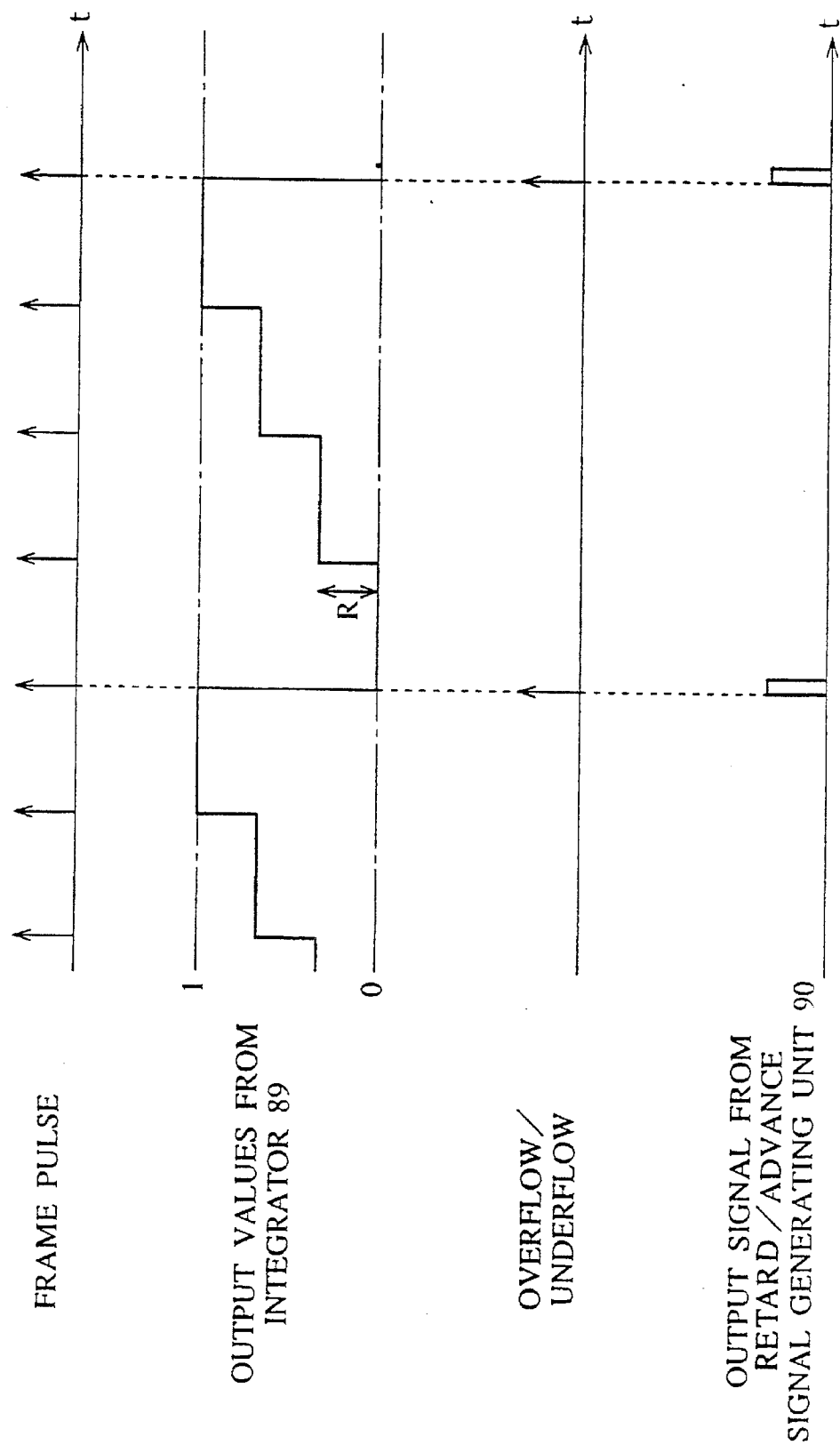

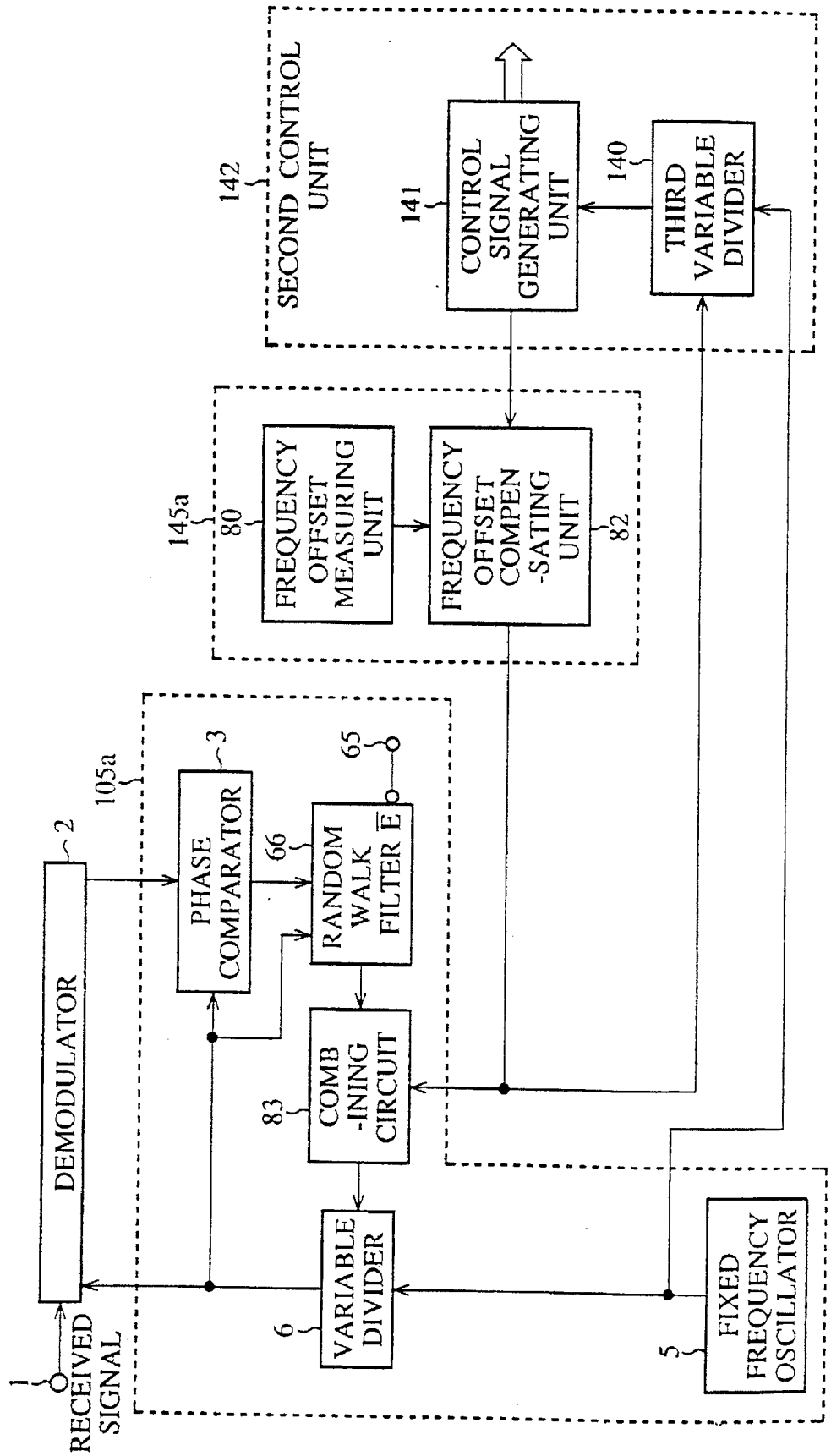

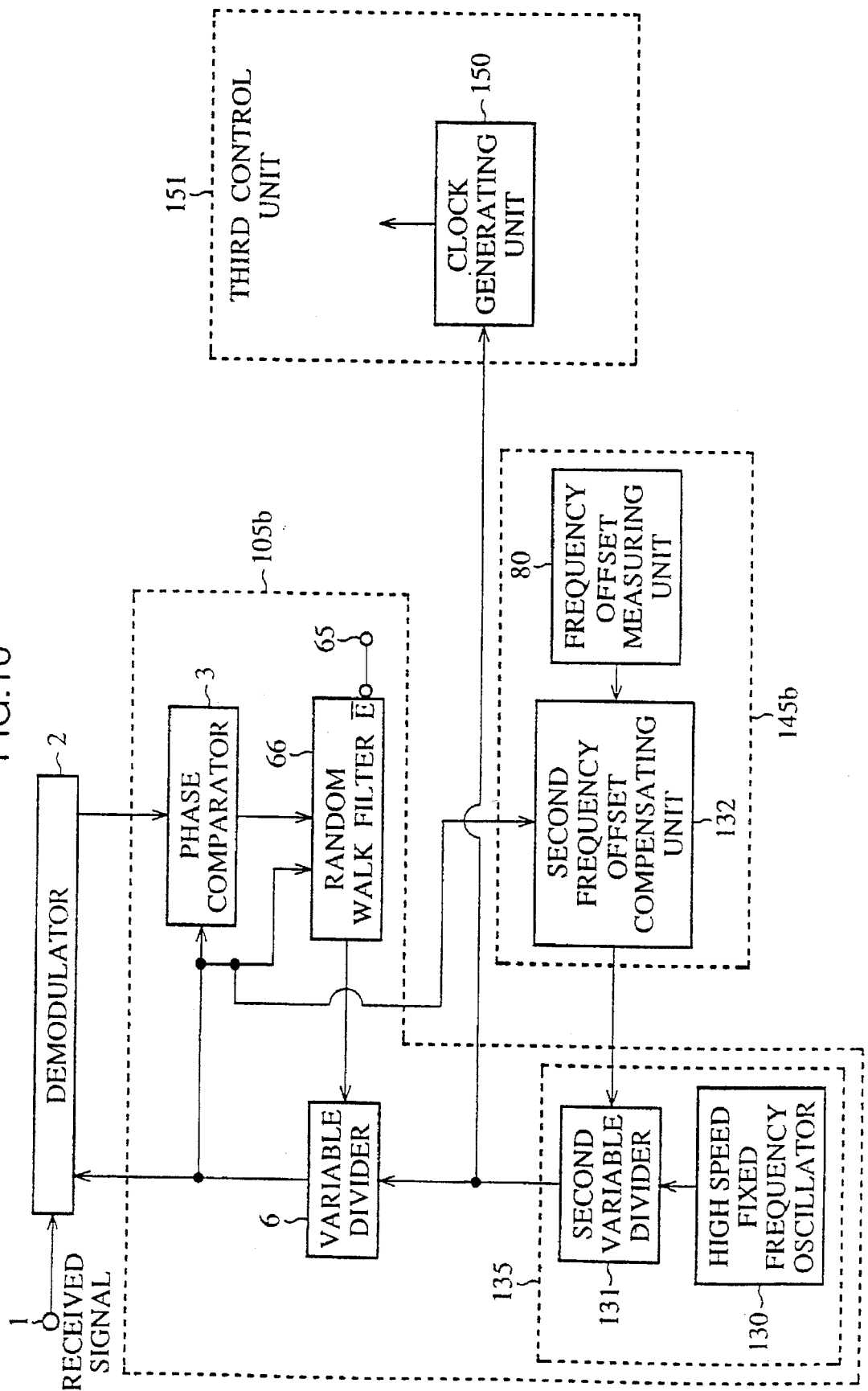

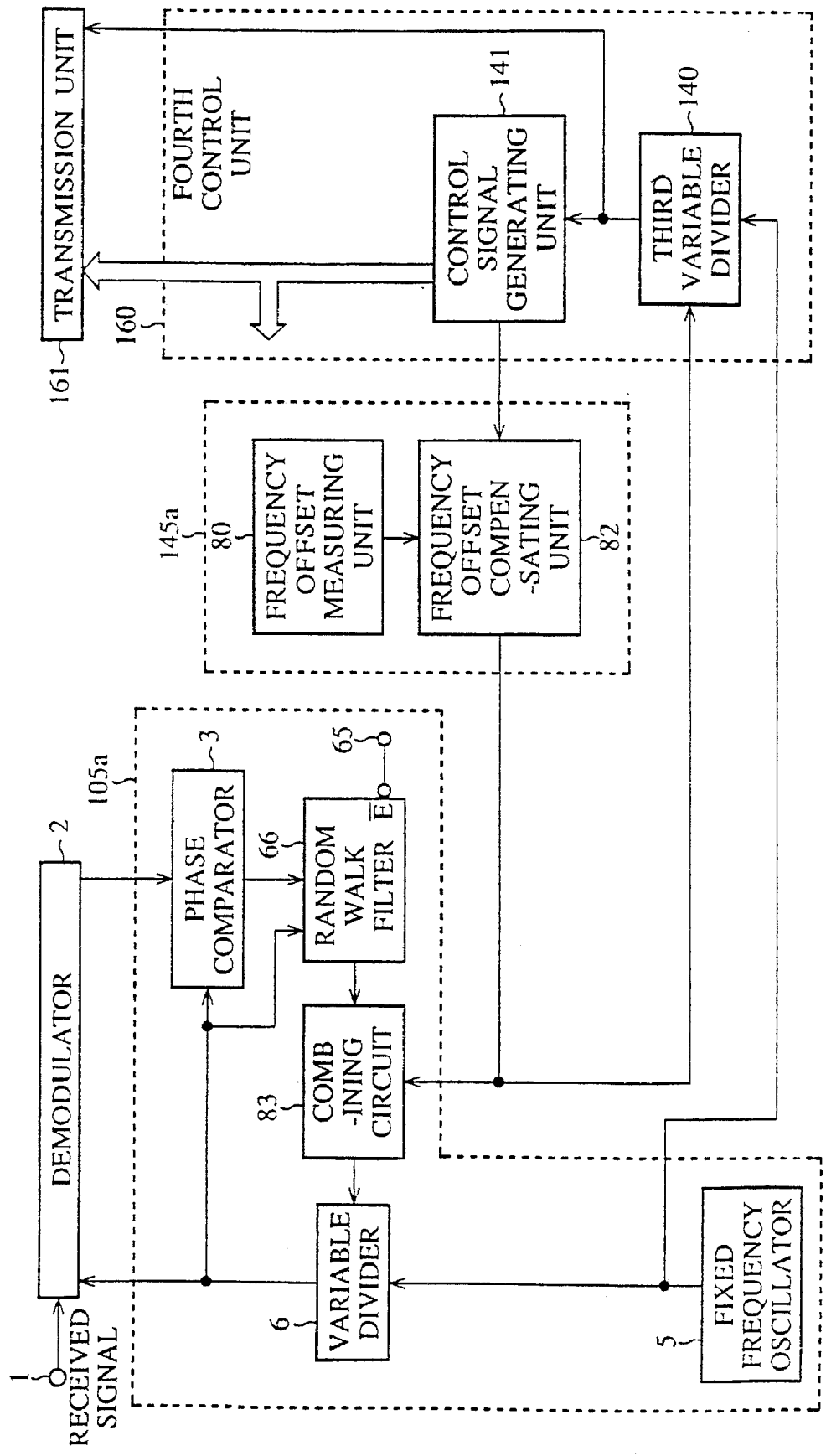

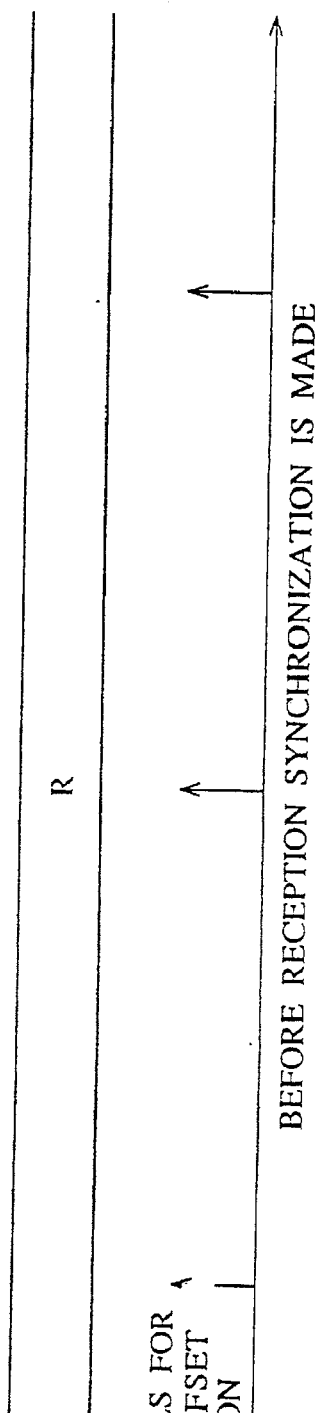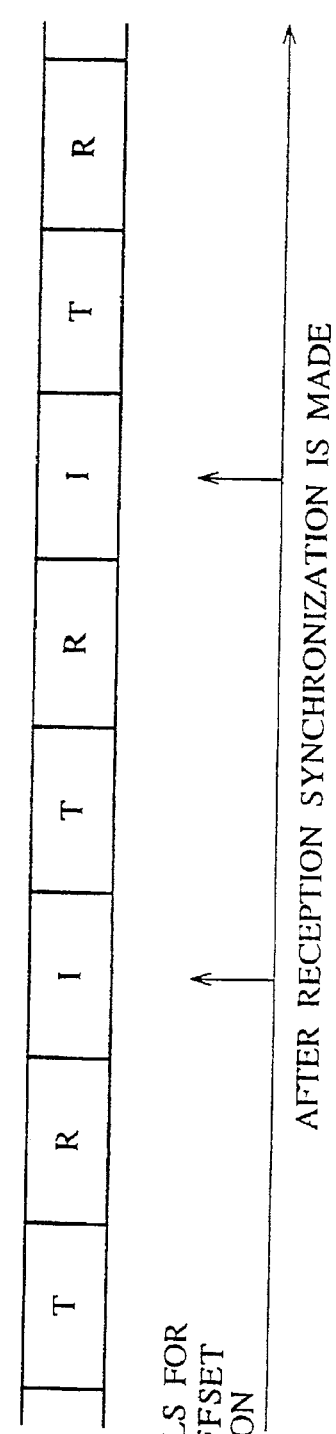

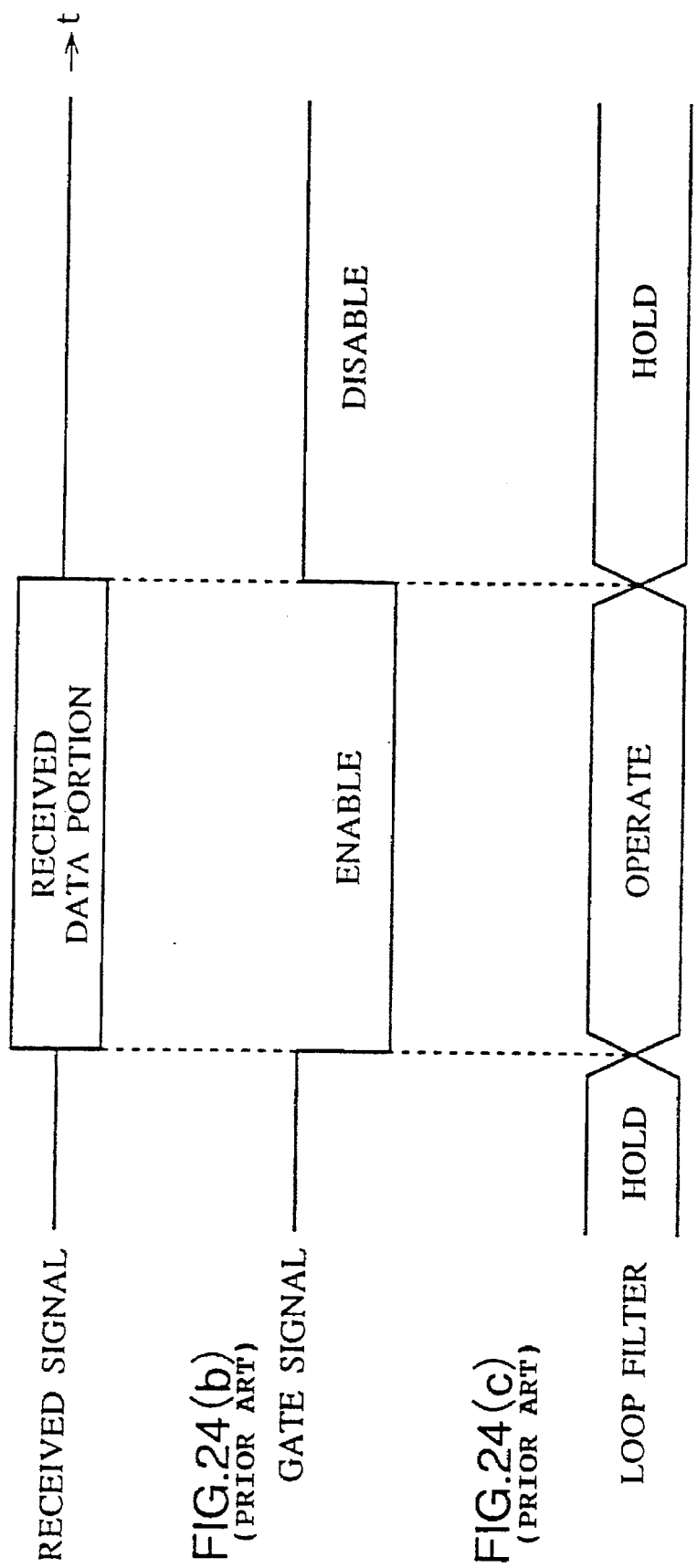

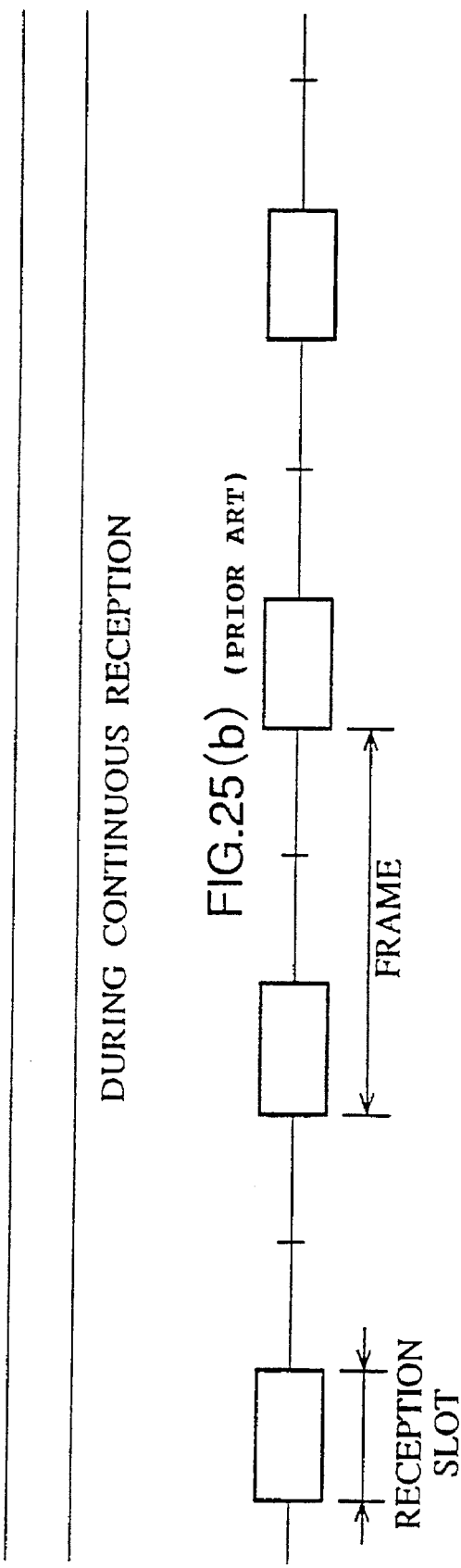
FIG.25(a) (PRIOR ART) DURING CONTINUOUS RECEPTION
FIG.25(b) (PRIOR ART) DURING RECEPTION OF 3ch TDM SIGNALS
FIG.25(c) (PRIOR ART) DURING INTERMITTENT RECEPTION

RECEIVER AND TRANSMITTER-RECEIVER

BACKGROUND OF THE INVENTION

1. Field of the Invention

The present invention relates to a digital communication receiver and a digital communication transmitter-receiver both suitable for use in satellite communications, mobile communications and mobile satellite communications.

2. Description of the Related Art

As a conventional clock recovery circuit, there is known one disclosed in a technical literature "Application for Digital Signal Processing" by The Institute of Electronics and Communication Engineers, p. 169, for example. FIG. 16 shows a system in which the clock recovery circuit has been subjected to digital PLL, i.e., a system called "zero cross method".

In FIG. 16, there are shown an input terminal 1 for inputting a received signal, a demodulator 2 for demodulating the received signal, a phase comparator 3 for detecting a difference in phase between a clock outputted from a variable divider 6 and a symbol clock component included in the received signal from an output produced from the demodulator 2, a random walk filter 4 for averaging outputs produced from the phase comparator 3, a fixed frequency oscillator 5 for oscillating at a frequency of an integral multiple of the symbol clock component included in the received signal, the variable divider 6 for dividing an output produced from the fixed frequency oscillator 5 at a division ratio corresponding to an output produced from the random walk filter 4 and outputting a clock synchronized with the symbol clock included in the received signal to each part, and a clock regenerating circuit 100 composed of the random walk filter 4, the fixed frequency oscillator 5 and the variable divider 6.

FIG. 17 is a block diagram showing one example of a configuration of a phase comparator. In FIG. 17, there are shown an input terminal 10 for inputting one bit corresponding to an MSB (Most Significant Bit) of a signal outputted from the demodulator 2, an input terminal 11 for inputting a clock outputted from the variable divider 6, an invertor 12 for inverting the output supplied from the input terminal 11, a first latch circuit 13 for latching the signal inputted from the input terminal 10 based on a clock outputted from the inversion circuit 12, a second latch circuit 14 for latching the signal inputted from the input terminal 10 based on the input clock supplied from the input terminal 11, third and fourth latch circuits 15 and 16 for respectively latching outputs produced from the first and second latch circuits 13 and 14 based on the clocks input from the input terminal 11, an exclusive-OR circuit 17 for XORing outputs supplied from the third and fourth latch circuits 15 and 16, an output terminal 18 for outputting a signal outputted from the exclusive-OR circuit 17 to the outside, an exclusive-OR circuit 19 for XORing the signals outputted from the second and fourth latch circuits 14 and 16, and an output terminal 20 for outputting a signal outputted from the exclusive-OR circuit 19 to the outside.

FIG. 19 is a block diagram showing one example of a configuration of the random walk filter 4. In FIG. 19, there are shown an input terminal 30 for inputting the output supplied from the output terminal 18, an input terminal 31 for inputting the output supplied from the output terminal 20, an input terminal 32 for outputting the clock outputted from the variable divider 6, a 2N step up/down counter 33 which is activated in response to the clock supplied from the input terminal 32, counts UP/DOWN in response to the signal inputted from the input terminal 30 and performs enable/disable operations in response to the signal inputted from the input terminal 31, an output terminal 34 for outputting a "Retard" signal when a value counted by the 2N step up/down counter 33 is 2N, an output terminal 35 for outputting an "Advance" signal when the value counted by the 2N step up/down counter 33 is 0, and an N setting circuit 36 for setting the count of the 2N step up/down counter 33 to a value N when either the "Retard" signal or the "Advance" signal is outputted.

FIG. 20 is a block diagram showing one example of a configuration of the variable divider 6. In FIG. 20, reference numeral 40 indicates an input terminal for inputting a "Retard" signal. Reference numeral 41 indicates an input terminal for inputting an "Advance" signal. Reference numeral 42 indicates a pulse adding/eliminating circuit for adding a pulse to the output of the fixed frequency oscillator 5 and eliminating it therefrom in response to the signal inputted from the input terminal 40 and the signal inputted from the input terminal 41 respectively. Reference numeral 43 indicates a divider for dividing an output produced from the pulse adding/eliminating circuit 42. Reference numeral 44 indicates an output terminal for outputting an output produced from the divider 43 to the outside.

The operation of the zero cross method shown in FIG. 16 will be described below. According to the present zero-cross method, the phase of the clock outputted from the variable divider 6 is controlled so that an average value of zero cross point data (1, 0) sampled based on the clock outputted from the variable divider 6 becomes "0.5", thereby phase-synchronizing the clock outputted from the variable divider 6 with the symbol clock component included in the received signal. The received signal inputted from the input terminal 1 is demodulated by the demodulator 2.

A sign bit (MSB: {1, 0}) represented in the form of a baseband waveform, of the output of the demodulator 2 is inputted to the phase comparator 3. In the phase comparator 3, the first latch circuit 13 samples data near a zero cross point from the signal inputted from the input terminal 10 and the second latch circuit 14 samples data near a Nyquist point from the signal. Further, the outputs of the first and second latch circuits 13 and 14 are latched in their corresponding third and fourth latch circuits 15 and 16 with timing of the clock inputted to the input terminal 11. At the same time the second latch circuit 1 4 samples data near the next Nyquist point.

FIG. 18(a) shows one example of a sample of a baseband signal. The present example shows a case where data varies from +1 to −1. FIG. 18(b) illustrates a waveform at the time that a soft decision signal in FIG. 18(a) is regarded as a hard decision {1, 0}. In this case, the second latch circuit 14 latches therein data near a Nyquist point at a time (m+1), the third latch circuit 15 latches therein data near a zero cross point at a time (m+(½)) and the fourth latch circuit 16 latches therein data near a Nyquist point at a time (m).

The exclusive-OR circuit 17 multiplies the output of the third latch circuit 15, i.e., zero cross point information at the time (m+(½)) by the output of the fourth latch circuit 16, i.e., Nyquist point information at the time (m) and outputs the result of multiplication from the output terminal 18. This is made because when the data changes from −1 to +1 and from +1 to −1, the sign of an error in clock phase and that of phase error information due to zero cross are made coincident with each other.

The output supplied from the output terminal 18 corresponds to "lead/lag" information about the clock and is controlled so that the average of output values becomes zero, i.e., "0.5" in the form of a sign bit (0, 1). In the present example, "0" is represented as an output in the case of "lead", whereas "1" is represented as an output in the case of "lag".

Further, the exclusive-OR circuit 19 XORs the output of the second latch circuit 14, i.e., Nyquist point information at the time (m+1) and the output of the fourth latch circuit 16, i.e., Nyquist point information at the time (m) and outputs the result of XORing from the output terminal 20.

When data remains unchanged between consecutive Nyquist points, zero cross point information produced during that time is made insignificant. It is therefore determined using the original signal whether the zero cross point information outputted from the output terminal 18 is "significant/insignificant".

In the present embodiment, "1" is outputted when the zero cross point information is "significant" and "0" is outputted when the zero cross point information is "insignificant".

Thus, the phase comparator 3 outputs the "lead" signal of "0" when the phase of the clock outputted from the variable divider 6 leads the zero cross point (or Nyquist point) and outputs the "lag" signal of "1" when the phase of the clock lags behind the zero cross point. And simultaneously, the signal which represents a "significant/insignificant" for "lag/lead" signal is outputted.

Next, the random walk filter 4 averages phase difference information on the output data produced from the phase comparator 3. The 2N step up/down counter 33 counts up/down based on the clock inputted from the input terminal 32 when the signal inputted from the input terminal 31 is "1", i.e., only when the output data of the phase comparator 3 is regarded as "significant". When the signal inputted from the input terminal 30 is "0", the count of the 2N step up/down counter 33 is incremented by one. On the other hand, when the signal is "1", the count is decremented by one.

Thus, when the value counted by the 2N step up/down counter 33 is brought to "2N", the 2N step up/down counter 33 outputs a "Retard" signal from the output terminal 34 and at the same time the N setting circuit 36 sets the count of the 2N step up/down counter 33 to a central value "N".

When the count is brought to "0", the 2N step up/down counter 33 outputs an "Advance" signal from the output terminal 35 in the same manner as described above and at the same time the N setting circuit 36 sets the count of the 2N step up/down counter 33 to the central value "N". Thus, the signal outputted from the phase comparator 3 is averaged by the 2N step up/down counter 33.

Next, the "Advance" and "Retard" signals outputted from the random walk filter 4 are inputted to the variable divider 6. An oscillating frequency of the fixed frequency oscillator 5 is normally selected to an integral multiple of a symbol rate.

If the symbol rate is represented as $f_S$(Hz) and the frequency outputted from the fixed frequency oscillator 5 is represented as $f_{OSC}$(Hz), then the following relationship is given:

$$f_{OSC}(Hz) = M\, f_S(Hz) \quad (M: \text{integer}) \tag{1}$$

When no signals are inputted from the input terminals 40 and 41, the signal outputted from the fixed frequency oscillator 5 passes through the pulse adding/eliminating circuit 42 and is inputted to the divider 43, which divides the frequency of the signal by M. Thus, the frequency-divided symbol rate ($f_S$) clock is outputted from the divider 43.

When the "Retard" signal is inputted from the input terminal 40, the pulse adding/eliminating circuit 42 eliminates clock pulse corresponding to one period from the clock signal outputted from the fixed frequency oscillator 5. As a result, the phase of the clock outputted from the divider 43 is delayed by a (1/M) period from the previous phase. On the other hand, when the "Advance" signal is inputted from the input terminal 41, the pulse adding/eliminating circuit 42 adds the clocks corresponding to the one period to the clock signal outputted from the fixed frequency oscillator 5. As a result, the phase of the clock outputted from the divider 43 leads the previous phase by the (1/M) period. The clock signal outputted from the divider 43 is phase-controlled based on the signals inputted from the input terminals 40 and 41 in this way.

Thus, the clock recovery circuit 100 using the "zero cross method" shown in FIG. 16 allows the clock outputted from the variable divider 6 to be phase-synchronized with the symbol clock component included in the received signal.

FIG. 21 is a view showing a configuration of a loop filter employed in the conventional secondary loop clock regenerating circuit. This loop filter is effective where a clock frequency offset corresponding to a difference between a frequency $f_{RX}$(Hz) of the symbol clock component included in the received signal and a free-running frequency $f_S$=($f_{OSC}$)/M(Hz) of the clock regenerating circuit exists.

In this case, the random walk filter 4 in the clock regenerating circuit 100 shown in FIG. 16 is partly changed as shown in FIG. 21.

Owing to such a secondary loop configuration, steady-state phase error produced due to the clock frequency offset developed in the primary loop configuration can be reduced. Incidentally, the secondary loop digital PLL has been described in a technical magazine "How to use PLL IC" published by Akiba publisher, p. 154, for example. The steady-state phase error has been described on page 26 in the same technical magazine.

In FIG. 21, there are shown an input terminal 50 for inputting a signal outputted from the phase comparator 3, an input terminal 51 for inputting a clock outputted from the variable divider 6, a code changing circuit 52 for converting a lead/lag signal (0, 1) to (−1, +1) when a "significant/insignificant" signal corresponding to the signal inputted to the input terminal 50 indicates "significant" and outputting "0" when the signal indicates "insignificant", an, adder 53 for adding an output value of the code changing circuit 52 and an output value of a latch circuit 54, a latch circuit 54 for latching an output value of the adder 53 therein in response to the clock inputted to the input terminal 51, a first integrator 55 comprising the adder 53 and the latch circuit 54, an adder 56 for adding an output value of the first integrator 55 and an output value of a latch circuit 57, the latch circuit 57 for latching an output value of the adder 56 therein in response to the clock inputted to the input terminal 51, a second integrator 58 composed of the adder 56 and the latch circuit 57, a comparator 59 for outputting a "Retard" signal or an "Advance" signal when the absolute value of a value outputted from the second integrator 58 is beyond a given value (e.g., when the integrator 58 is brought to overflow or underflow), an adder 60 for adding a signal outputted from the random walk filter 4 and the signal outputted from the comparator 59, and an output terminal 61 for outputting the output of the adder 60 to the outside.

The operation of the clock recovery circuit 100 shown in FIG. 16 at the time when the random walk filter 4 of the clock recovery circuit 100 is partially changed as shown in FIG. 21, will now be described.

The output of the phase comparator 3 shown in FIG. 16 is divided into the "lead/lag" signal and the "significant/insignificant" signal, one of which is inputted to the random walk filter 4 and the other of which is inputted to the code changing circuit 52. The random walk filter 4 is activated as described above to output the "Advance/Retard" signal. On the other hand, the code changing circuit 52 outputs "0" when the "significant/insignificant" signal indicates "insignificant", outputs "+1" when the "significant/insignificant" signal indicates "significant" and the "lead/lag" signal indicates "lead" and outputs "−1" when the "significant/insignificant" signal indicates "significant" and the "lead/lag" signal indicates "lag". A value (0, ±1) outputted from the code changing circuit 52 is inputted to the first integrator 55 and is subjected to integral processing for each output clock of the variable divider 6. Further, the signal outputted from the first integrator 55 is integrated by the second integrator 58.

When a frequency offset Δf(Hz) corresponding to a difference between a symbol clock component frequency $f_{RX}$ (Hz) included in a received signal and a free-running frequency $f_S$(Hz) of the clock recovery circuit now exists, a numeric value (Δf information) corresponding to the frequency deviation Δf(Hz) is stored in the latch circuit 54.

The Δf information is integrated by the second integrator 58 and exceeds a threshold value of the comparator 59 at substantially constant intervals. The comparator 59 outputs an "Advance/Retard" signal therefrom. FIG. 22 shows, as one example, an output value of the second integrator 58 at the time when the Δf information is a positive value and the manner in which the comparator 59 outputs the "Retard" signal.

When the output value (Δf information) of the first integrator 55 is now correct, the comparator 59 outputs the "Retard" signal so as to compensate for a phase shift produced due to the frequency deviation. Therefore, the "lead/lag" signal outputted from the phase comparator 3 is generated substantially at the same frequency.

As a result, the output value of the first integrator 55 is maintained at the present value on the average. In this condition, the symbol clock outputted from the variable divider 6 is phase-synchronized with the frequency $f_{RX}$(Hz) of the symbol clock component included in the received signal.

Thus, even when the frequency offset Δf(Hz) corresponding to the difference between the symbol clock component frequency $f_{RX}$(Hz) included in the received signal and the free-running frequency $f_S$(Hz) of the clock recovery circuit exists, the phase synchronization can be performed without the stationary phase error owing to the secondary loop configuration shown in FIG. 21.

A configuration of a loop filter employed in a clock recovery circuit at the time that a signal to be received is intermittently input as in the case of a TDMA (Time Division Multiple Access) system, a TDM (Time Division Multiplex) system and VOX (Voice Operated Transmission) control on SCPC (Single Carrier Per Channel), is shown in FIG. 23.

In the same drawing, components having the same functions as those shown in FIG. 21 are identified by the same symbols. Reference numeral 65 indicates an input terminal for inputting a gate signal to the loop filter. Reference numeral 66 indicates a random walk filter whose operation is controlled by the gate signal. Reference numeral 67 indicates a third integrator constructed so that a gate terminal is added to the first integrator 55 and whose operation is controlled by the gate signal. Reference numeral 68 indicates a fourth integrator constructed so that a gate terminal is added to the second integrator 58 and whose operation is controlled by the gate signal.

The operation of the loop filter shown in FIG. 23 will now be described. When a signal to be received is intermittently input as shown in FIG. 24(a), the clock recovery circuit malfunctions due to only noise components other than the received signal upon operating the clock recovery circuit at all times.

In order to avoid such a malfunction, a gate signal shown in FIG. 24(b), which is rendered "LOW" only during reception, is inputted from the input terminal 65 and the loop filter (corresponding to the random walk filter 66, the third integrator 67 and the fourth integrator 68 in FIG. 23) of the clock recovery circuit is rendered "HOLD" as shown in FIG. 24(c) when no received signal exists. The entirety of the clock recovery circuit is brought into a free-running state in this way. Thus, the clock recovery circuit is normally activated under the presence of the received signal and is free-run under the absence of the received signal, thereby making it possible to prevent the clock recovery circuit from taking in the noise alone and malfunctioning.

However, when the frequency offset Δf(Hz) corresponding to the difference between the symbol clock component frequency $f_{RX}$(Hz) included in the received signal and the free-running frequency $f_S$(Hz) of the clock recovery circuit exists and a non-reception time interval is long, i.e., a time interval necessary for the clock recovery circuit to freely run is long, a problem arises that a phase shift occurs due to the frequency offset Δf(Hz) and the clock recovery circuit is rendered asynchronous upon the next reception.

FIGS. 25(a), 25(b) and 25(c) respectively illustrate examples of received signals obtained during continuous reception, reception of 3ch TDM signals and intermittent reception.

During continuous reception and reception of 3ch TDM signals as shown in FIGS. 25(a) and 25(b), the clock recovery circuit can hold synchronization. However, when a non-reception time interval is very long as during intermittent reception shown in FIG. 25(c), the clock recovery circuit cannot hold synchronization.

The receiver and transmitter-receiver each having the conventional clock recovery circuit are constructed as described above. In the receiver and transmitter-receiver described above, a problem arises that when the frequency offset corresponding to the difference between the symbol clock component frequency included in the received signal and the free-running frequency of the clock recovery circuit exits and the non-reception time interval is very long, the clock recovery circuit cannot maintain phase synchronization. Another problem arises that when the control unit is operated based on the clock outputted from the clock recovery circuit, the control unit cannot maintain phase synchronization. A further problem arises that when a signal to be transmitted is generated using each clock outputted from the control unit, the accuracy of generating the signal to be transmitted, based on the clock is lowered.

SUMMARY OF THE INVENTION

With the foregoing problems in view, it is therefore an object of the present invention to provide a receiver and a transmitter-receiver each having a clock regenerating means and a control means each of which is capable of maintaining phase synchronization even when a frequency offset corresponding to a difference between a symbol clock component frequency included in a received signal and a free-running frequency of the clock recovery. circuit exists and a non-reception time interval is long.

It is another object of the present invention to provide a transmitter-receiver wherein a signal to be transmitted has an average high-precision transmission clock even when a frequency offset corresponding to a difference between a symbol clock component frequency included in a received signal and a free-running frequency of a clock regenerating circuit exists and a non-reception time interval is very long.

According to a first aspect of the present invention, for achieving the above objects, there is provided a receiver comprising demodulating means for demodulating a received signal; clock recovery means for generating a clock phase-synchronized with a symbol clock component included in the received signal; and frequency offset compensating means for controlling a variable division ratio of a variable divider constituting a phase-controlled loop of the clock recovery means so as to compensate for a frequency offset corresponding to a difference between a frequency of the symbol clock component included in the received signal and a free-running frequency of the clock recovery means. The compensation for the frequency deviation is performed with operation timing different from that of the clock regenerating means.

In the receiver constructed as described above, the frequency offset compensating means controls the variable division ratio of the variable divider constituting the phase-controlled loop of the clock regenerating means so as to compensate the frequency offset corresponding to the difference between the symbol clock component frequency included in the received signal and the free-running frequency of the clock recovery means with the operation timing different from that of the clock recovery means. As a result, phase synchronization can be maintained even when a non-reception time interval is long.

According to a second aspect of the present invention, there is provided a receiver comprising demodulating means for demodulating a received signal; clock recovery means for generating a clock phase-synchronized with a symbol clock component included in the received signal; and frequency offset compensating means for controlling a variable division ratio of a variable divider constituting a phase-controlled loop of the clock recovery means so as to compensate for a frequency offset corresponding to a difference between a frequency of the symbol clock component included in the received signal and a free-running frequency of the clock recovery means. The compensation for the frequency offset is performed with operation timing corresponding to a frame pulse or a slot pulse.

In the receiver constructed as described above, the frequency offset compensating means controls the variable division ratio of the variable divider constituting the phase-controlled loop of the clock recovery means so as to compensate the frequency offset corresponding to the difference between the symbol clock component frequency included in the received signal and the free-running frequency of the clock recovery means with the operation timing equivalent to the frame pulse or the slot pulse. As a result, phase synchronization can be maintained even when a non-reception time interval is long.

According to a third aspect of the present invention, there is provided a receiver comprising demodulating means for demodulating a received signal; clock recovery means for generating a clock phase-synchronized with a symbol clock component included in the received signal; reference clock generating means for variably dividing a frequency of a high-speed clock so as to produce a reference clock for the clock recovery means; and frequency offset compensating means for controlling a variable division ratio for the high-speed clock of the reference clock generating means so as to compensate for a frequency offset corresponding to a difference between a frequency of the symbol clock component included in the received signal and a free-running frequency of the clock recovery means. The compensation for the frequency offset is performed with operation timing different from that of the clock recovery means.

In the receiver constructed as described above, the frequency offset compensating means controls the variable division ratio for the high-speed clock of the reference clock generating means included in the clock recovery means so as to compensate the frequency offset corresponding to the difference between the symbol clock component frequency included in the received signal and the free-running frequency of the clock recovery means with the operation timing different from that of the clock recovery means. As a result, phase synchronization can be held even when a non-reception time interval is long.

According to a fourth aspect of the present invention, there is provided a receiver comprising demodulating means for demodulating a received signal; clock recovery means for generating a clock phase-synchronized with a symbol clock component included in the received signal; frequency offset compensating means for controlling a variable division ratio of a variable divider constituting a phase-controlled loop of the clock recovery means so as to compensate for a frequency offset corresponding to a difference between a frequency of the symbol clock component included in the received signal and a free-running frequency of the clock recovery means with operation timing different from that of the clock recovery means; and control means for receiving a reference clock of the clock recovery means therein, controlling and compensating a variable division ratio of the variable divider based on frequency offset information of the frequency offset compensating means and generating clocks for operating respective parts in the receiver and other devices concerned therewith and signals for controlling them.

In the receiver constructed as described above, the frequency offset compensating means controls the variable division ratio of the variable divider constituting the phase-controlled loop of the clock recovery means so as to compensate the frequency offset corresponding to the difference between the symbol clock component frequency included in the received signal and the free-running frequency of the clock recovery means with the operation timing different from that of the clock recovery means. As a result, phase synchronization can be maintained even when a non-reception time interval is long. Further, since the control means receives the reference clock of the clock recovery means therein and controls and compensates the variable division ratio of the variable divider based on the frequency offset information of the frequency offset compensating means, phase synchronization of the control means can also be maintained.

According to a fifth aspect of the present invention, there is provided a transmitter-receiver comprising demodulating means for demodulating a received signal; clock recovery means for generating a clock phase-synchronized with a symbol clock component included in the received signal; reference clock generating means for variably dividing a frequency of a high-speed clock so as to produce a reference clock for the clock recovery means; frequency offset compensating means for controlling a variable division ratio for the high-speed clock of the reference clock generating means so as to compensate for a frequency offset corresponding to a difference between a frequency of the symbol clock component included in the received signal and a free-running frequency of the clock recovery means with operation timing different from that of the clock recovery means; and control means for receiving therein a reference clock whose frequency offset is compensated, from the clock recovery means so as to generate clocks for operating respective parts in the transmitter-receiver and other devices concerned therewith and signals for controlling them.

In the transmitter-receiver constructed as described above, the frequency offset compensating means controls the variable division ratio for the high-speed clock of the reference clock generating means included in the clock recovery means so as to compensate the frequency offset corresponding to the difference between the symbol clock component frequency included in the received signal and the free-running frequency of the clock recovery means with the operation timing different from that of the clock recovery means. Thus, phase synchronization can be maintained even when a non-reception time interval is long. Further, since the control means receives therein the reference clock whose frequency offset has been compensated, from the clock recovery means and sets it as a reference clock used within the control unit, phase synchronization of the control means can also be maintained.

According to a sixth aspect of the present invention, there is provided a transmitter-receiver comprising demodulating means for demodulating a received signal; clock recovery means for generating a clock phase-synchronized with a symbol clock component included in the received signal; frequency offset compensating means for controlling a variable division ratio of a variable divider constituting a phase-controlled loop of the clock recovery means so as to compensate for a frequency offset corresponding to a difference between a frequency of the symbol clock component included in the received signal and a free-running frequency of the clock recovery means with operation timing different from that of the clock recovery means; and control means for receiving a reference clock of the clock recovery means therein, controlling and compensating a variable division ratio of the variable divider based on frequency offset information of the frequency offset compensating means and generating clocks for operating respective parts in the transmitter-receiver and other devices concerned therewith and signals for controlling them. The compensation for the frequency offset is performed based on transmission timing information of the control means during a time interval other than a transmission time interval.

In the transmitter-receiver constructed as described above, the frequency offset compensating means controls the variable division ratio of the variable divider constituting the phase-controlled loop of the clock recovery means so as to compensate the frequency offset corresponding to the difference between the symbol clock component frequency included in the received signal and the free-running frequency of the clock recovery means with the operation timing different from that of the clock recovery means. Thus, phase synchronization can be maintained even when a non-reception time interval is long. Further, since the control means receives the reference clock from the clock recovery means and controls and compensates the variable division ratio of the variable divider based on the frequency offset information of the frequency offset compensating means, phase synchronization of the control means can also be maintained. Further, even if the transmission clock is not phase-controlled during transmission, transmission can be performed using an average high-precision transmission clock by compensating the frequency offset based on the transmission timing information of the control means during the time interval other than the transmission time interval.

According to a seventh aspect of the present invention, there is provided a transmitter-receiver comprising demodulating means for demodulating a received signal; clock recovery means for generating a clock phase-synchronized with a symbol clock component included in the received signal; reference clock generating means for variably dividing a frequency of a high-speed clock so as to produce a reference clock for the clock recovery means; frequency offset compensating means for controlling a variable division ratio for the high-speed clock of the reference clock generating means so as to compensate for a frequency offset corresponding to a difference between a frequency of the symbol clock component included in the received signal and a free-running frequency of the clock recovery means with operation timing different from that of the clock recovery means; and control means for receiving therein a reference clock whose frequency offset is compensated, from the clock recovery means so as to generate clocks for operating respective parts in the transmitter-receiver and other devices concerned therewith and signals for controlling them. The compensation for the frequency offset is performed based on transmission timing information of the control means during a time interval other than a transmission time interval.

In the transmitter-receiver constructed as described above, the frequency offset compensating means controls the variable division ratio for the high-speed clock of the reference clock generating means included in the clock recovery means so as to compensate the frequency offset corresponding to the difference between the symbol clock component frequency included in the received signal and the free-running frequency of the clock recovery means with the operation timing different from that of the clock recovery means. As a result, phase synchronization can be maintained even when a non-reception time interval is long. Further, since the control means receives therein the reference clock whose frequency offset has been compensated, from the clock recovery means and sets it as a reference clock used within the control unit, phase synchronization of the control means can also be maintained. Furthermore, even if the transmission clock is not phase-controlled during transmission, transmission can be performed using an average high-precision transmission clock by compensating the frequency offset based on the transmission timing information of the control means during the time interval other than the transmission time interval.

According to an eighth aspect of the present invention, there is provided a transmitter-receiver comprising demodulating means for demodulating a received signal; clock recovery means for generating a clock phase-synchronized with a symbol clock component included in the received signal; frequency offset compensating means for controlling a variable division ratio of a variable divider constituting a phase-controlled loop of the clock recovery means so as to compensate for a frequency offset corresponding to a difference between a frequency of the symbol clock component included in the received signal and a free-running frequency of the clock recovery means with operation timing different from that of the clock recovery means; and control means for receiving a reference clock of the clock recovery means therein, controlling and compensating a variable division ratio of a variable divider based on frequency offset information of the frequency offset compensating means and generating clocks for operating respective parts in the transmitter-receiver and other devices concerned therewith and signals for controlling them. The compensation for the frequency offset is performed with free-running timing until reception synchronization is made, and is performed during a time interval other than a transmission time interval after the reception synchronization has been made.

In the transmitter-receiver constructed as described above, the frequency offset compensating means controls the variable division ratio of the variable divider constituting the phase-controlled loop of the clock recovery means so as to compensate the frequency offset corresponding to the difference between the symbol clock component frequency included in the received signal and the free-running frequency of the clock recovery means with the operation timing different from that of the clock recovery means, thereby making it possible to maintain phase synchronization even when a non-reception time interval is long. Further, since the control means receives the reference clock from the clock recovery means and controls and compensates the variable division ratio of the variable divider based on the frequency offset information of the frequency offset compensating means, phase synchronization of the control means can also be maintained. Furthermore, since a phase shift produced due to the frequency offset is corrected regardless of before and after the reception synchronization is made, by compensating the frequency offset with the free-running timing until the reception synchronization is made and compensating the frequency offset during the time interval other than the transmission time interval after the reception synchronization has been made, transmission can be performed using an average high-precision transmission clock even when a free-running state is held during transmission.

The above and other objects, features and advantages of the present invention will become apparent from the following description and the appended claims, taken in conjunction with the accompanying drawings in which preferred embodiments of the present invention are shown by way of illustrative example.

BRIEF DESCRIPTION OF THE DRAWINGS

FIG. 3(a) is a view for describing received signals obtained during reception of 3ch TDM signals and FIG. 3(b) is a view for describing received signals obtained during intermittent reception;

FIG. 4 is a view for explaining the operation of the frequency offset compensating unit shown in FIG. 1;

FIG. 9 is a block diagram showing a configuration of a third embodiment of the present invention;

FIG. 10 is a block diagram depicting a configuration of a fourth embodiment of the present invention;

FIG. 11 is a block diagram illustrating a configuration of a fifth embodiment of the present invention;

FIGS. 15(a) and 15(b) are respectively transmit-receive timing charts for describing the operation of the seventh embodiment shown in FIG. 14;

FIGS. 24(a), 24(b) and 24(c) are respectively views for describing operations of the loop filter shown in FIG. 23; and FIGS. 25(a), 25(b) and 25(c) are respectively a view showing one example of a received signal obtained during continuous reception, a view illustrating one example of received signals obtained during reception of 3ch TDM signals and a view depicting one example of received signals obtained during intermittent reception.

DETAILED DESCRIPTION OF THE PREFERRED EMBODIMENTS

Preferred embodiments of the present invention will hereinafter be described in detail with reference to the accompanying drawings.

[First Embodiment]

Figure 1:
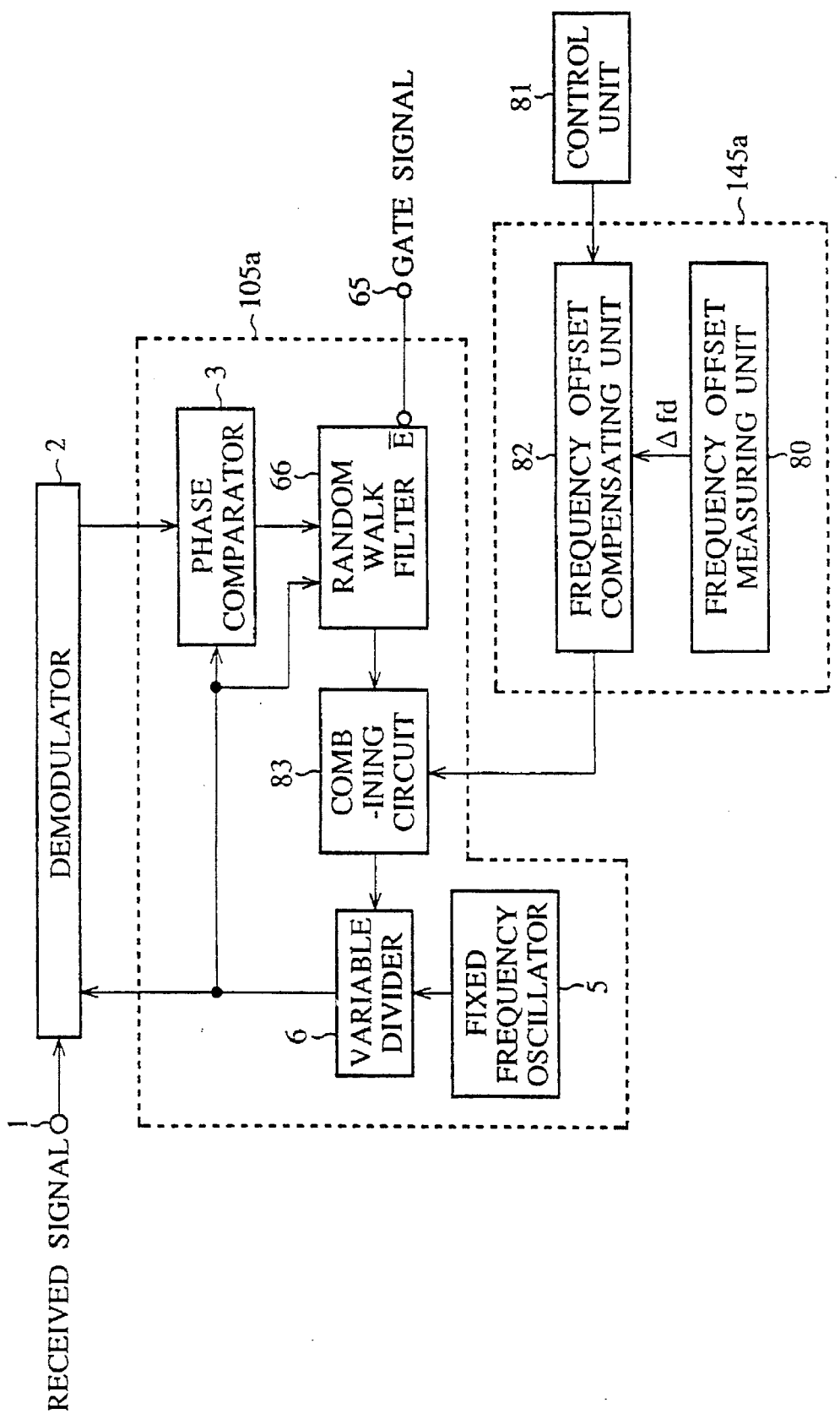
FIG. 1 is a block diagram showing a configuration of a first embodiment of the present invention.

FIG. 1 is a block diagram showing a configuration of a first embodiment of the present invention. In the drawing, the same elements as those shown in a conventional example are identified by the same symbols.

The conventional receiver described above has a problem that a difference (hereinafter called properly "frequency offset") between a frequency of a symbol clock component included in a received signal and a free-running frequency in a clock recovery circuit exists and when a non-reception time interval is long, phase synchronization cannot be maintained. In the present embodiment in contrast to the above, a frequency offset compensating means is activated based on a control signal produced from a control unit and information about a frequency offset or a difference between a frequency of a symbol clock component included in a received signal and a free-running frequency in a clock recovery circuit without depending on a reception time interval to thereby compensate for a phase shift at the time of non-reception.

Referring to FIG. 1, reference numeral 80 indicates a frequency offset measuring unit for measuring a frequency offset or a difference between a frequency component of a symbol clock included in a received signal and a free-running frequency of a clock recovery circuit and a offset conformable to the frequency offset. Reference numeral 81 indicates a control unit of a receiver, which generates clocks for operating respective parts of the receiver so as to control timing. Reference numeral 82 indicates a frequency offset compensating unit for outputting an "Advance/Retard" signal based on frequency offset information corresponding to an output of the frequency offset measuring unit 80 and a control signal corresponding to an output of the control unit 81. Reference numeral 83 indicates a combining circuit for combining an "Advance/Retard" signal outputted from a random walk filter 66 with the "Advance/Retard" signal outputted from the frequency offset compensating unit 82 to thereby output an "Advance/Retard" signal for controlling a variable divider 6.

Figure 2:
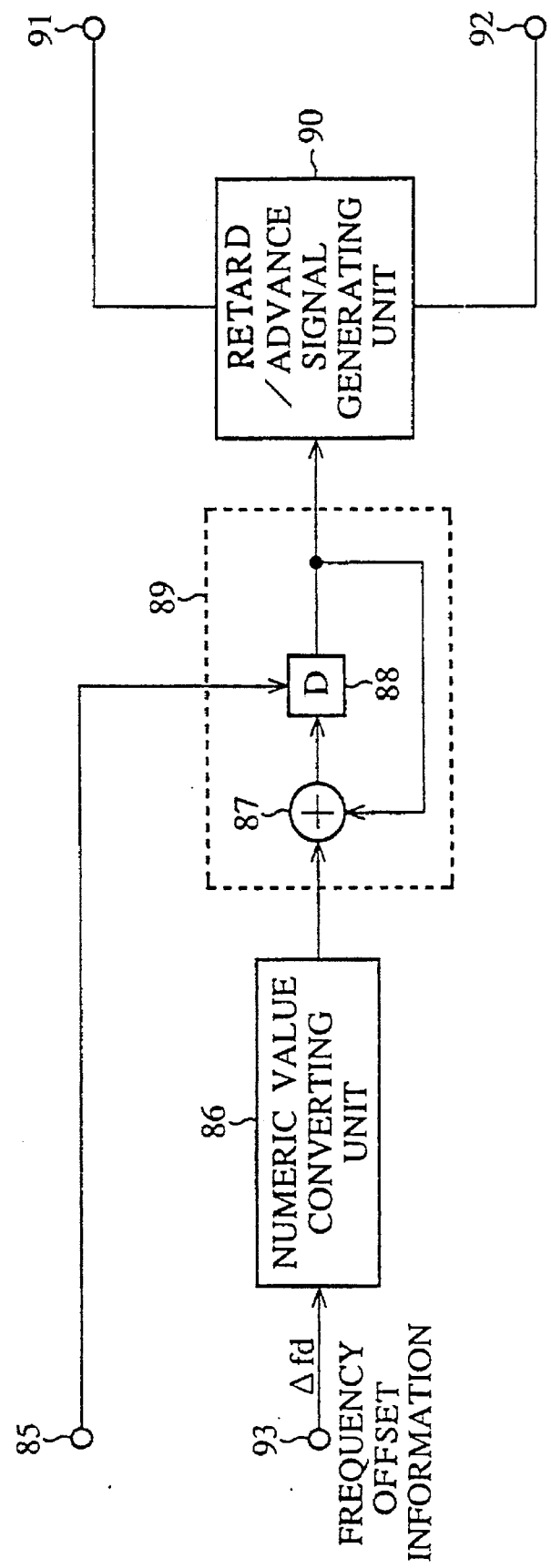
FIG. 2 is a block diagram showing a configuration of a frequency offset compensating unit shown in FIG. 1.

FIG. 2 shows one example of a configuration of the frequency offset compensating unit 82 shown in FIG. 1. In FIG. 2, there are shown an input terminal 93 for inputting the output of the frequency offset measuring unit 80, an input terminal 85 for inputting the control signal outputted from the control unit 81, a numeric value converting unit 86 for converting the frequency offset information inputted from the input terminal 93 to a numeric value used for the frequency offset compensating unit 82, an adder 87 for adding together a value outputted from the numeric value converting unit 86 and a value outputted from a D flip-flop 88, the D flip-flop 88 for latching a value outputted from the adder 87 therein in response to the control signal inputted from the input terminal 85, an integrator 89 comprising the adder 87 and the D flip-flop 88, a "Retard/Advance" signal generating unit 90 for outputting an "Advance" signal or a "Retard" signal therefrom based on a value outputted from the integrator 89, an output terminal 91 for outputting the "Retard" signal generated from the "Retard/Advance" signal generating unit 90, and an output terminal 92 for outputting the "Advance" signal generated from the "Retard/Advance" signal generating unit 90.

A description will first be made of a case where clock frequency control is performed at each frame period upon receipt of 3ch TDM signals.

FIG. 3(a) is a view showing one example of a configuration of each frame at the time of reception of 3ch TDM signals. Now consider that a frequency offset information $\Delta f_d(Hz)$, i.e., a difference between a symbol clock component frequency $f_{RX}(Hz)$ included in a received signal and a free-running frequency $f_S(Hz)$ of the clock recovery circuit is obtained by an arbitrary method and the value of the frequency offset information is set as a value corresponding to the controlling of "Advance" of the variable divider 6 to K times in every L frames. When "Retard" control is made, a value K is represented as a negative value. A frame pulse outputted with timing of the head of reception slots shown in FIG. 3 is regarded as one example of the control signal outputted from the control unit 81.

The numeric value converting unit 86 converts the frequency offset information $\Delta f_d(Hz)$ to a value "R" inputted to the integrator 89 in accordance with the following equation:

$$R = K/L \text{ (where } R: \text{real number, } |R| \leq 1 \quad (2)$$
$$K: \text{integer}$$
$$L: \text{positive integer)}$$

The integrator 89 integrates the value R at each frame pulse signal. Each of output values produced from the integrator 89 is increased like each of $\{0, R, 2R, 3R, \ldots\}$ and is brought to the value K in L frees. When "R" is a positive number each time each integral value of output values of the integrator 89 varies, the Retard/Advance signal generating unit 90 outputs an "Advance" signal from the output terminal 92. On the other hand, when "R" is a negative number each time each integral value of the output values thereof varies, the Retard/Advance signal generating unit 90 outputs a "Retard" signal from the output terminal 91. Thus, the "Retard" signal and the "Advance" signal are not simultaneously outputted from the output terminals 91 and 92.

In the above-described operation, the integrator 89 may integrate an absolute-value range of "0 to 1". Further, the "Retard/Advance" signal generating unit 90 may detect an overflow flag or an underflow flag with respect to each integral part.

FIG. 4 shows examples of frame pulses, output values from the integrator 89 and a signal outputted from the "retard/Advance" signal generating unit 90, i.e., a signal outputted from the frequency offset compensating unit 82.

The "Retard/Advance" signal outputted from the frequency offset compensating unit 82 passes through the combining circuit 83 so as to control the variable divider 6 to thereby enable compensation for a phase shift due to a frequency offset. At this time, control for performing phase synchronization is executed by the phase comparator 3, the random walk filter 66 and the combining circuit 83. Incidentally, such phase synchronization control is executed only upon reception slot based on a gate signal shown in FIG. 24(b) illustrative of the conventional example.

A description will now be made of the operation of the first embodiment where the non-reception time interval is long, an intermittent reception is made, for example. FIG. 3(b) shows one example of a configuration of each reception frame at the time of the intermittent reception. Since, in this case, the reception frames are received only in a unit of a super frame composed of a plurality of frames, a clock recovery means comprising the phase comparator 3, the random walk filter 66, the combining circuit 83, the variable divider 6 and a fixed frequency oscillator 5 is activated only on a super frame basis in response to a gate signal inputted from a terminal 65.

On the other hand, since a frequency offset compensating means comprised of the frequency offset measuring unit 80 and the frequency offset compensating unit 82 performs control in a unit of a frame corresponding to each frame pulse without depending on a 3ch-TDM signal reception and an intermittent reception, the frequency offset compensating means compensates for a phase shift due to a frequency offset almost as frequently as that of the 3ch TDM signal reception even in the intermittent reception.

According to the present embodiment as described above, since the frequency offset compensating means is activated based on the control signal produced from the control unit and the resultant desired frequency offset information without depending on the reception time interval so as to compensate for the non-reception phase shift produced due to the frequency offset corresponding to the difference between the frequency of the symbol clock component included in the received signal and the free-running frequency of the clock regenerating circuit, the phase synchronization can be maintained even when the non-reception time interval is long.

As a method of obtaining the same effects as described above, the frequency or cycle of occurrence of the control signal outputted from the control unit 81 may be changed without setting the frequency offset information as the value to be inputted to the integrator 89.

When the frequency offset is large and it is necessary to control the variable divider 6 once or more at each frame, the frequency of occurrence of the control signal equivalent to the frame pulse, which is outputted from the control unit, may be increased or the variable divider 6 may be controlled plural times for each control signal. Further, gradual compensation for the frequency offset information can cope with a change in temperature, a change with the passage of time, etc. The frequency offset compensating means may be activated only when the non-reception time interval is long upon intermittent reception, for example. If the control unit 81 is set so as to output the control signal (e.g., frame pulse) upon non-reception, then the "Retard/Advance" signal outputted from the random walk filter 66 and the "Retard/Advance" signal outputted from the frequency offset compensating unit 82 can be prevented from being simultaneously outputted. A voltage-controlled oscillator may be used as an alternative to the fixed frequency oscillator 5.

A description will now be made of three examples of configurations of the frequency offset measuring unit for outputting the frequency offset information $\Delta f_d$. Incidentally, the three frequency offset measuring units may be singly used. Alternatively, they may be used in combination to improve the accuracy of measurement of each frequency offset measuring unit.

Figure 5:
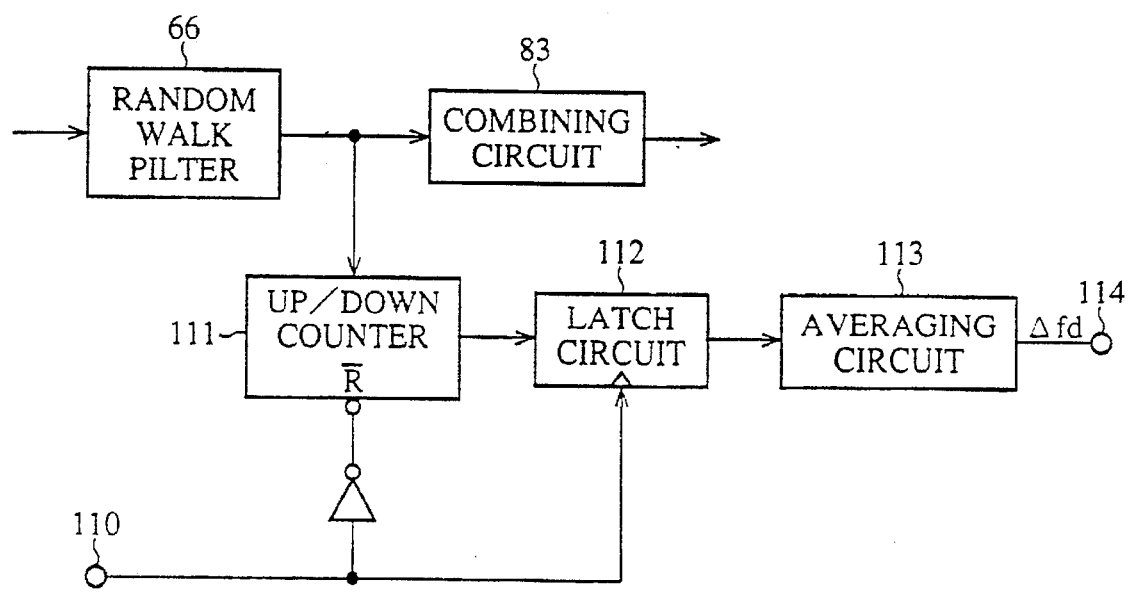
FIG. 5 is a block diagram showing a first example of a configuration of a frequency offset measuring unit shown in FIG. 1.

FIG. 5 shows the first example of the configuration of the frequency offset measuring unit for outputting the frequency offset information $\Delta f_d$. In the drawing, the same elements as those shown in FIG. 1 are identified by the same symbols.

Referring to FIG. 5, reference numeral 110 indicates an input terminal for inputting a pulse at unit time intervals. Reference numeral 111 indicates an up/down counter for counting up when an "Advance" signal is outputted from the random walk filter 66 and counting down when a "Retard" signal is outputted and resetting a value in response to the pulse inputted from the i put terminal 110. Reference numeral 112 indicates a latch circuit for latching therein a value counted by the counter 111 in response to the pulse inputted from the input terminal 110. Reference numeral 113 indicates an averaging circuit for averaging output values of the latch circuit 112 once or more. Reference numeral 114 indicates an output terminal for outputting a value produced from the averaging circuit 113.

The operation of the frequency offset measuring unit shown in FIG. B will now be described. When the frequency offset information $\Delta f_d$(Hz) corresponding to the difference between the symbol clock component frequency $f_{RX}$(Hz) included in the received signal and the free-running frequency $f_S$(Hz) of the clock recovery circuit exists and recovered clocks are synchronized in phase in this condition, the control signal such as the "Retard" signal or the "Advance" signal is outputted from the clock recovery circuit or the random walk filter 66 to compensate for the phase shift produced due to the frequency offset, i.e., to follow the symbol clock component included in the received signal.

When $f_S$(Hz)>$f_{RX}$(Hz), the "Retard" signal is often outputted on the average. On the other hand, when $f_s$(Hz)<$f_{RX}$(Hz), the "Advance" signal is often outputted on the average. The frequency of occurrence of each signal varies depending on the amount of a frequency offset. Thus, the amount of the frequency offset can be uniformly detected by counting the number of times per unit time that the random walk filter 66 outputs the signal, i.e., the amount of control of the variable divider 6, using the up/down counter 111. The up/down counter 111 is reset after counted values have been latched in the latch circuit 112. The averaging circuit 113 averages the counted values measured in the above-described manner, i.e., the amount of frequency offsets to improve the accuracy of measurement and outputs the average as the frequency offset information $\Delta f_d$. Thus, the frequency offset information can be obtained. Incidentally, the provision of the averaging circuit 113 as an integrator or insertion of an integrator into a stage subsequent to the output of the averaging circuit 113 makes it possible to follow a change in the frequency offset.

Figure 6:
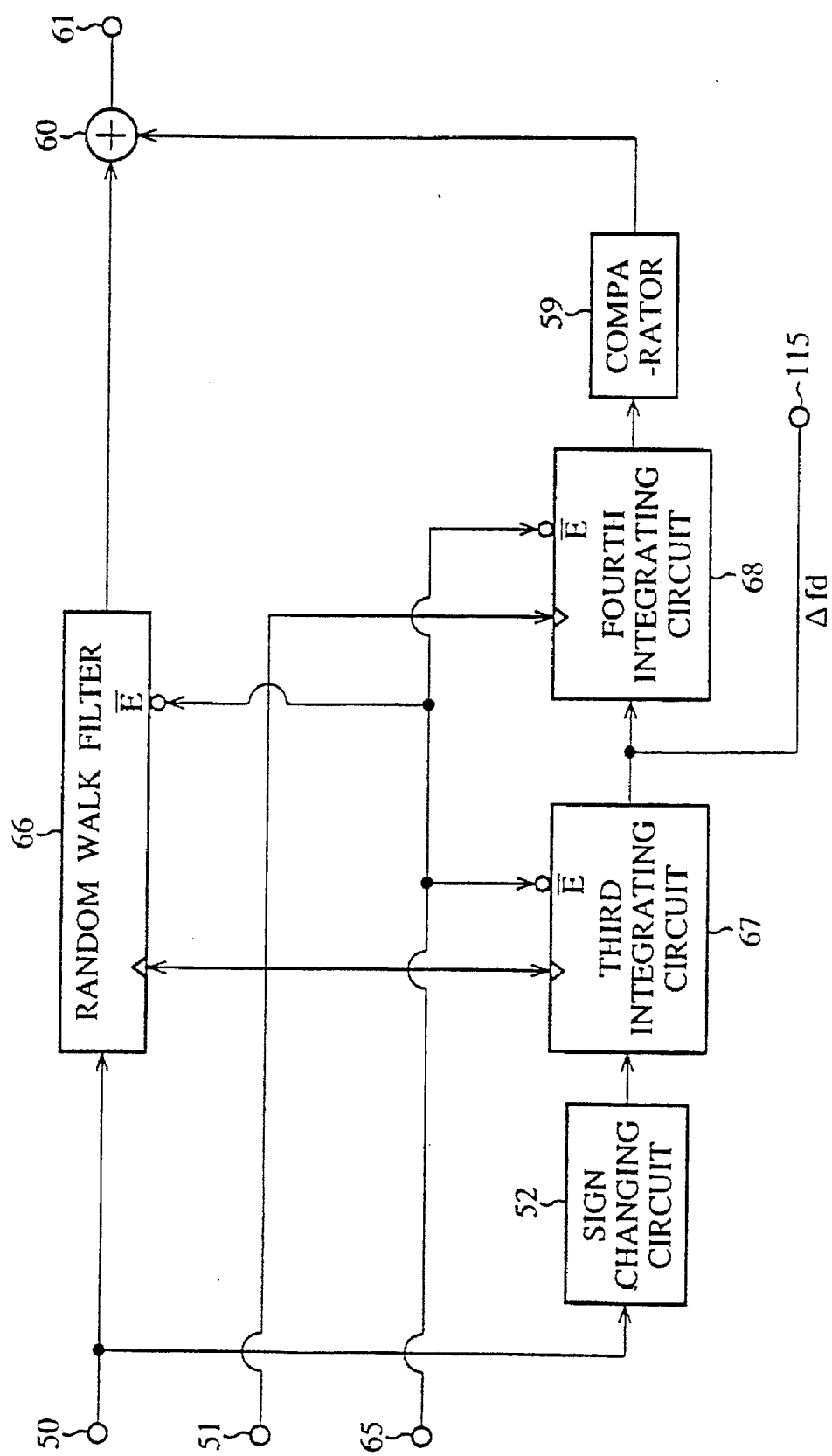
FIG. 6 is a block diagram illustrating a second example of a configuration of the frequency offset measuring unit shown in FIG. 1.
Figure 23:
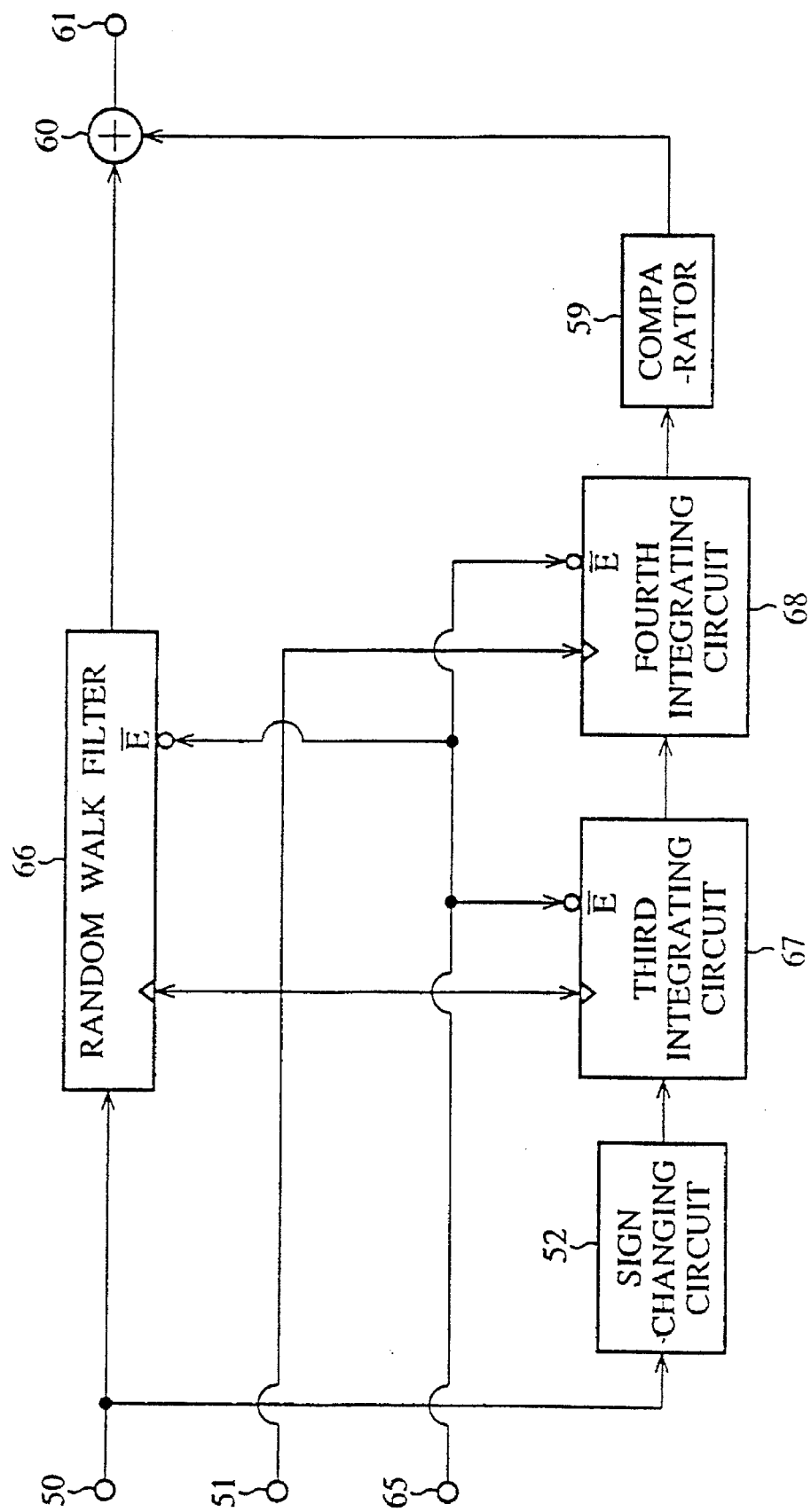
FIG. 23 is a view illustrating a configuration of a loop filter of another conventional clock regenerating circuit.

FIG. 6 illustrates the second example of the configuration of the frequency offset measuring unit. In the drawing, components having the same functions as those shown in FIG. 23 are identified by the same symbols. In FIG. 6, reference numeral 115 indicates an output terminal for outputting a value produced from a third integrator 67.

The operation of the frequency offset measuring unit shown in FIG. 6 will now be described. In a clock recovery circuit using a loop filter shown in FIG. 23, frequency offset information is stored in the third integrator 67 when recovered clocks are synchronized in phase. Thus, the frequency offset information $\Delta f_d$ can be obtained by outputting the output of the third integrator 67 to the outside from the output terminal 115. The accuracy of measurement may be improved by averaging output values of the third integrator 67. Alternatively, an integrator may be inserted into a subsequent stage to follow a change in the frequency offset.

Figure 7:
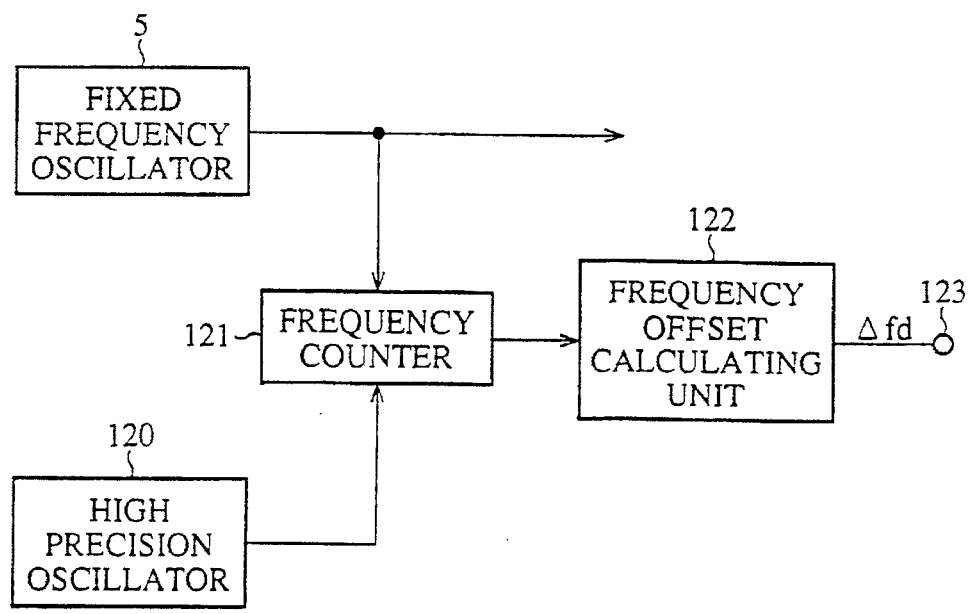
FIG. 7 is a block diagram depicting a third example of a configuration of the frequency offset measuring unit shown in FIG. 1.

FIG. 7 shows the third example of the configuration of the frequency offset measuring unit. In the drawing, components having the same functions as those shown in FIG. 1 are identified by the same symbols.

In FIG. 7, reference numeral 120 indicates a high precision oscillator that a receiver or a transmitter/receiver has. Reference numeral 121 indicates a frequency counter for counting a frequency of a fixed frequency oscillator on the basis of the output of the high precision oscillator 120. Reference numeral 122 indicates a frequency offset calculating unit for calculating a frequency offset of the fixed frequency oscillator 5 based on an output value of the frequency counter 121. Reference numeral 123 indicates an output terminal for outputting an output value of the frequency offset calculating unit 122 to the outside.

The operation of the frequency offset measuring unit shown in FIG. 7 will now be described. If the frequency outputted from the fixed frequency oscillator 5 is counted on the basis of the output of the high precision oscillator 120, then the output frequency of the fixed frequency oscillator 5 can be counted with a precision of the high precision oscillator 120 in principle. The frequency offset calculating unit 122 calculates the frequency offset corresponding to the output of the fixed frequency oscillator 5 based on the counted value and can set it as frequency offset information $\Delta f_d$(Hz).

As an alternative to the three frequency offset measuring units as described above, a system for measuring a frequency offset with other means and providing it as an initial value may be adopted.

[Second Embodiment]

Figure 8:
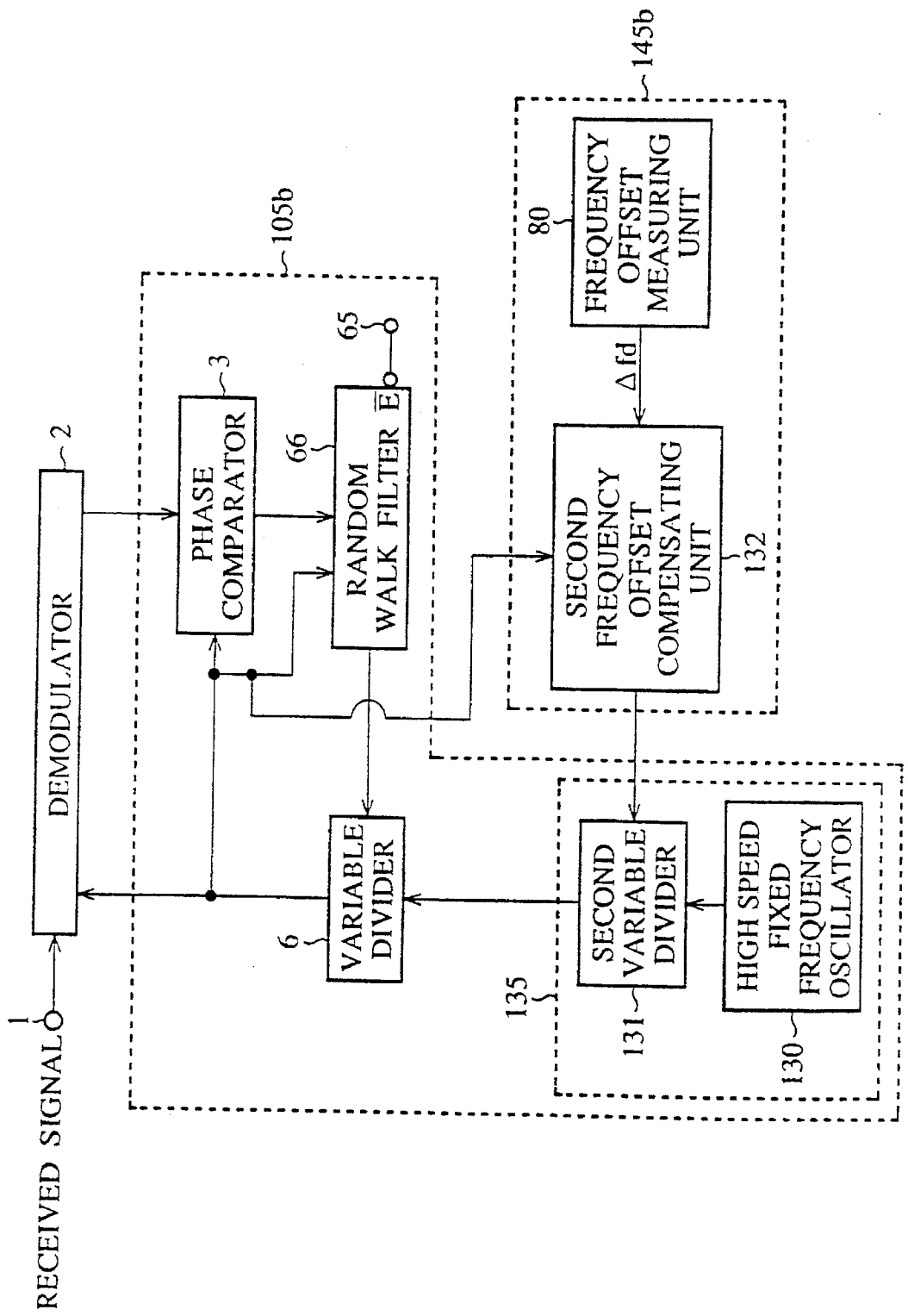
FIG. 8 is a block diagram illustrating a configuration of a second embodiment of the present invention.

FIG. 8 is a block diagram showing a configuration of a second embodiment of the present invention. In the drawing, the same elements as those shown in the conventional example and the aforementioned embodiment are identified by the same symbols. In the present embodiment, a division ratio of high-speed clocks is controlled to frequency-control a reference clock produced from a clock recovery circuit as an alternative to the compensation for the phase shift produced due to the frequency offset, based on the "Retard/Advance" signal of the variable divider in the clock recovery circuit.

Referring to FIG. 8, reference numeral 130 indicates a high speed fixed oscillator oscillated at a frequency of an integral multiple of the reference clock frequency $f_{OSC}$(Hz) of a variable divider 6, which is expressed in the equation (1). Reference numeral 131 indicates a second variable divider for frequency-dividing a clock outputted from the high speed fixed oscillator 130 in accordance with a division ratio controlled based on a control signal outputted from a second frequency offset compensating unit 132. Reference numeral 132 indicates the second frequency offset compensating unit for outputting a "Retard/Advance" signal to the second variable divider 131 in a period corresponding to frequency offset information outputted from a frequency offset measuring unit 80.

The operation of the embodiment shown in FIG. 8 will now be described. The high speed fixed oscillator 130 is subjected to frequency division by the second variable divider 131. A clock outputted from the second variable divider 131 is used as the reference clock for the variable divider 6. When the second variable divider 131 is in a non-controlled state, the high speed fixed oscillator 130 and the second variable divider 131 perform a function similar to that of the fixed oscillator 5 for producing the reference clock.

Frequency offset information $\Delta f_d$(Hz) corresponding to a difference between a symbol clock component frequency $f_{RX}$(Hz) included in a received signal and a free-running frequency $f_S$(Hz) of a clock recovery circuit is inputted to the second frequency offset compensating unit 132 from the frequency offset measuring unit 80. Incidentally, the frequency offset information $\Delta f_d$(Hz) is obtained from the same frequency offset measuring unit as that employed in the first embodiment. The second frequency offset compensating unit 132 is identical in basic configuration to the frequency offset compensating unit 82 shown in FIG. 2. A numeric value converting unit 86 in the second frequency offset compensating unit 132 outputs a numeric value S corresponding to the input frequency offset information and inputs it to an integrator 89. The integrator 89 accumulates values S every recovered clocks to obtain {0, S, 2S, 3S, . . . } as output values. Further, a "Retard/Advance" signal generating unit 90 outputs a "Retard" signal or an "Advance" signal therefrom according to each output value of the integrator 89. When the "Retard" signal is input to the second variable divider 131, the second variable divider 131 delays the phase of the clock outputted from the second variable divider 131 by one period of the clock outputted from the high speed fixed oscillator 130. On the other hand, when the "Advance" signal is inputted to the second variable divider 131, the second variable divider 131 advances the phase thereof by one period of the clock.

As a result, an average frequency outputted from the second variable divider 131 varies and an average value of the free-running frequency of the variable divider 6 with the average frequency as original oscillations becomes equal to the frequency of the symbol clock included in the received signal. It is therefore possible to equivalently compensate for the frequency offset.

Even when a non-reception time interval is long as upon intermittent reception, the variable divider 6 is in a free-running state and the clock frequency compensating means is in operation. Thus, the phase synchronization can be maintained even when the non-reception time interval becomes long.

In the present embodiment as described above, the original oscillations of the variable divider 6 are generated by a reference clock generating means 135 composed of the high speed fixed oscillator 130 and the second variable divider 131. Further, the second variable divider 131 is operated based on the resultant frequency offset information (e.g., either this information or the frequency offset information obtained from the frequency offset measuring unit described in the first embodiment), the recovered clock and a signal conformable to the recovered clock to thereby compensate for the phase shift at the time of non-reception, which is produced due to the frequency offset corresponding to the difference between the symbol clock component frequency in the received signal and the free-running frequency of the clock recovery circuit. It is therefore possible to maintain the phase synchronization even when the non-reception time interval is long.

As a means for obtaining the same effect as described above, the second frequency offset compensating unit 132 may use a control signal outputted from a control unit, which is other than the recovered clock. As a means for changing the frequency with which the second frequency offset compensating unit 132 outputs the signal, according to the frequency offset, the frequency of operation of the integrator 89 may be changed without changing the signal input to the integrator 89 to another. Further, a high speed voltage-controlled oscillator may be used as an alternative to the high speed fixed oscillator 130. Any of the three frequency offset measuring means described in the first embodiment may be used as the frequency offset measuring unit. Alternatively, a system for measuring a frequency offset with other means and providing it as an initial value may be adopted.

[Third Embodiment]

FIG. 9 is a block diagram showing a configuration of a third embodiment of the present invention. In the drawing, the same elements as those shown in the conventional example and the aforementioned embodiments are identified by the same symbols.

In the present embodiment, a clock generating unit or portion in the control unit, which is beyond a timing recovery circuit, can maintain phase synchronization of the control unit as well by compensating for a phase shift produced due to a frequency offset.

Referring to FIG. 9, reference numeral 140 indicates a third variable divider phase-controlled based on a signal outputted from a frequency offset compensating unit 82 with an output of a fixed oscillator 5 as a reference clock. Reference numeral 141 indicates a control signal generating unit for generating respective control signals using an output produced from a third variable divider 140. Reference numeral 142 indicates a second control unit having the third variable divider 140 and the control signal generating unit 141, for generating clocks for operating a receiver and respective parts of other devices concerned therewith to thereby control timing.

The operation of the embodiment shown in FIG. 9 will now be described. The second control unit 142 causes the third variable divider 140 to generate operating clocks with the output of the fixed oscillator 5 as the reference clock and generates the clocks for operating the receiver and the respective parts of other devices based on the output of the third variable divider 140 so as to control the timing. The role of the second control unit 142 includes, for example, creation of frame pulses and an aperture used for detection after synchronization.

Thus, if frequency control is not performed by the second control unit 142 when the output of the fixed oscillator 5 identical to the clock recovery circuit is used as the reference clock as shown in FIG. 9, then respective signals generated from the second control unit 142 are phase-shifted when a frequency offset corresponding to a difference between a symbol clock component frequency included in a received signal and a free-running frequency of the third variable divider 140 exists, thereby making it unable to maintain phase synchronization. Therefore, a "Retard/Advance" signal or a signal equivalent to that signal outputted from the frequency offset compensating unit 82 is inputted to the third variable divider 140, where the phase shift produced due to the frequency offset is corrected in a manner similar to the variable divider 6.

Even when a non-reception time interval is long, such as during intermittent reception, the third variable divider 140 can maintain phase synchronization in a manner similar to the variable divider 6 because it compensates for a clock frequency even upon non-reception.

In the present embodiment as described above, since the third variable divider 140 for generating the operating clocks in the second control unit 142 is controlled based on the "Retard/Advance" signal corresponding to the output of the frequency offset compensating unit 82, the third variable divider 140 also compensates for the phase shift at the time of the non-reception, which is produced due to the frequency offset corresponding to the difference between the symbol clock component frequency included in the received signal and the free-running frequency of the third variable divider 140. Therefore, the phase synchronization of the second control unit 142 can be maintained even when the non-reception time interval is long.

In the present embodiment, a division ratio of the variable divider 6 does not necessarily require to be identical to that of the third variable divider 140. The division ratios may differ from each other.

As a means for obtaining the same effect as described above, an output produced from the variable divider 6 may be used as an alternative to the output of the third variable divider 140. The phase of the clock outputted from the third variable divider 140 may follow that of the clock outputted from the variable divider 6.

A system for measuring a frequency offset using any of the three frequency offset measuring methods described in the first embodiment or other method and providing the result of measurement as an initial value may be adopted as the frequency offset measuring unit.

[Fourth Embodiment]

FIG. 10 is a block diagram showing a configuration of a fourth embodiment of the present invention. In the drawing, the same elements as those shown in the conventional example and the aforementioned embodiments are identified by like symbols.

In the present embodiment, phase synchronization of a control unit can be maintained by using an output produced from a second variable divider 131 in which a frequency offset has been corrected, as a reference clock for a clock generating unit provided within the control unit.

Referring to FIG. 10, reference numeral 150 indicates a clock generating unit for generating operating clocks used for a third control unit 151 with the clock outputted from the second variable divider 131 as the reference clock. Reference numeral 151 indicates the third control unit having the clock generating unit 150, for generating clocks for operating respective parts of a receiver and other parts concerned therewith so as to control timing.

The operation of the embodiment shown in FIG. 10 will now be described. The clock generating unit 150 uses the clock outputted from the second variable divider 131 as the reference clock. The third control unit 151 generates the clocks for operating the respective parts of the receiver and the other parts concerned therewith, based on the reference clock so as to control the timing. The second variable divider 131 can maintain the phase synchronization of the third control unit 151 as well in a manner similar to the clock recovery circuit owing to compensation for the frequency offset by the second frequency offset compensating unit 132.

In the present embodiment as described above, the phase synchronization of the third control unit 151 can also be maintained together with that of the clock recovery circuit by using the output clock of the second variable divider 131 which constitutes the clock recovery circuit and in which the frequency offset has been corrected, as the reference clock used for the clock generating unit 150 for generating the operating clocks of the third control unit 151.

A system for measuring a frequency offset using any of the three frequency offset measuring methods described in the first embodiment or other method and providing the result of measurement as an initial value may be adopted as the frequency offset measuring unit.

[Fifth Embodiment]

FIG. 11 is a block diagram showing a configuration of a fifth embodiment of the present invention. In the drawing, the same elements as those shown in the conventional example and the aforementioned embodiments are identified by the same symbols.

In the present embodiment, transmission using an average high-precision clock can be made even in the case of a system of uncontrolling the phase of a clock upon transmission, which has been described in a technical literature "RCR STD-27B 4.1.9.1—Standard Transmission Timing of Mobile Station", for example, by setting a control signal for compensating for a frequency offset so as to be outputted during a time interval other than a transmission time interval using transmission timing recognized by a transmitter-receiver and by employing, in a transmitting unit, the clock that has compensated for the frequency offset.

In FIG. 11, reference numeral 160 indicates a fourth control unit having a third variable divider 140 and a control signal generating unit 141, for supplying each transmission clock and each control signal to a transmission unit 161. Reference numeral 161 indicates the transmission unit for performing signal transmission based on the output clock and control signal of the fourth control unit 160.

Figure 12A:
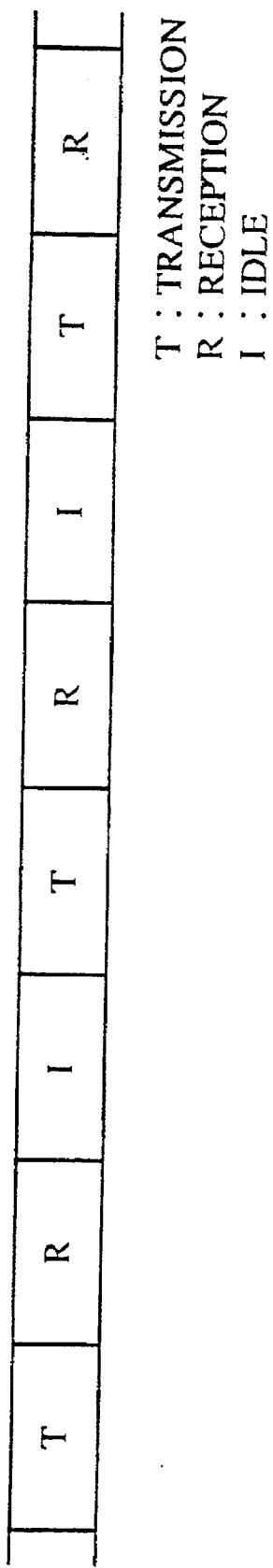
FIGS. 12(a) and 12(b) are respectively transmit-receive timing charts for describing the operation of the fifth embodiment shown in FIG. 11.

The operation of the embodiment shown in FIG. 11 will now be described. Now, consider that transmission and reception signal timing has a frame configuration shown in FIG. 12(a). In this case, a control signal generating unit 141 outputs a control signal for compensating for a frequency offset therefrom with timing shown in FIG. 12(b). When the control signal for compensating for the frequency offset is outputted with that timing, a phase shift produced due to the frequency offset is compensated during each idle period even when the output of the third variable divider 140 is of a free-running frequency upon transmission. Therefore, an average high-precision clock can be obtained as the transmission clock.

In this embodiment as described above, the transmission using the average high-precision transmission clock can be made even when the operating clock is of the free-running frequency upon transmission, by performing the transmission based on the operating clock and the control signal both outputted from the fourth control unit 160 and activating the frequency offset compensating unit 82 during the time interval other than the transmission time interval.

Figure 12B:
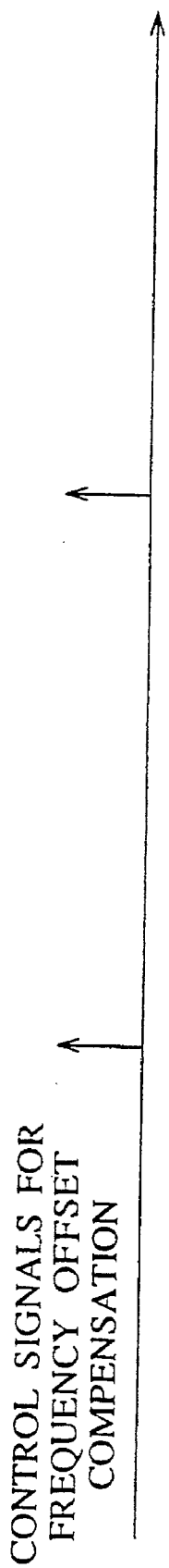

Even when the phase of the clock outputted from the third variable divider 140 is allowed to follow the phase of a clock outputted from a variable divider 6, the transmission using the average high-precision clock can be made by allowing the phase of the output clock of the third variable divider 140 to follow that of the output clock of the variable divider 6 during the time interval other than the transmission time interval or compensating for the frequency offset with timing shown in FIG. 12(b).

Even when the output of the variable divider 6 is employed in the control signal generating unit 141 and the transmission unit 161, the transmission using the average high-precision clock can be performed by compensating for the frequency offset with timing shown in Fag. 12(b). A means for measuring a frequency offset with any of the three frequency offset measuring means described in the first embodiment or other means and providing it as an initial value can also be adopted as a frequency offset measuring unit.

[Sixth Embodiment]

Figure 13:
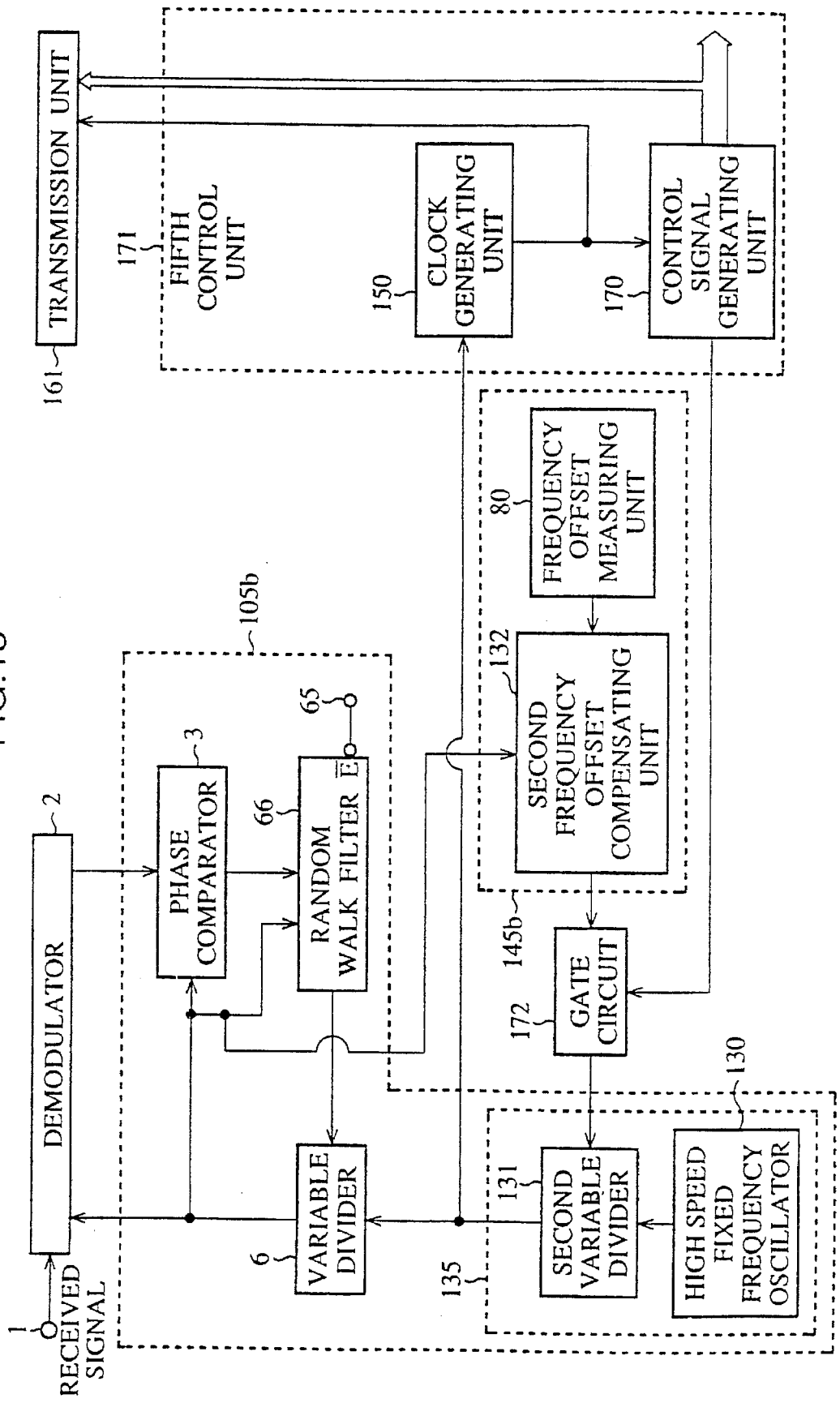
FIG. 13 is a block diagram showing a configuration of a sixth embodiment of the present invention.

FIG. 13 is a block diagram showing a configuration of a sixth embodiment of the present invention. In the drawing, the same elements as those described in the conventional example and the aforementioned embodiments are identified by the same symbols.

In the present embodiment, transmission can be performed based on an average high-precision clock even when each clock is of a free-running frequency upon transmission, by performing compensation for the clock frequency offset at the clock recovery circuit and the control unit both described in the fourth embodiment during a time interval other than a transmission time interval.

Referring to FIG. 13, reference numeral 170 indicates a control signal generating unit for generating clocks for operating respective parts of a transmitter-receiver and control signals for the transmitter-receiver, based on a clock outputted from a clock generating unit 150, so as to control timing. Reference numeral 171 indicates a fifth control unit having the clock generating unit 150 and the control signal generating unit 170, for supplying each of transmission clocks and each control signal to a transmission unit 161. Reference numeral 172 indicates a gate circuit for gating an output signal of a second frequency offset compensating unit 132 with a gate signal outputted from the control signal generating unit 170.

The operation of the embodiment shown in FIG. 13 will now be described. The clock generating unit 150 is activated with a clock which is outputted from a second variable divider 131 and whose frequency offset has been compensated, as a reference clock. The control signal generating unit 170 generates each of the control signals for the transmitter-receiver based on the clock outputted from the clock generating unit 150 to thereby control timing.

The transmission unit 161 performs transmission based on the operating clocks and the control signals outputted from the control unit 171. The control signal generating unit 170 inputs an enable gate signal to the gate circuit 172 during the time interval other than the transmission time interval.

As a result, since the output clock of the second variable divider 131 is subjected to control for compensation for the clock frequency offset for the time interval other than the transmission time interval to compensate for a phase shift produced due to the frequency offset, each transmission clock becomes a free-running frequency upon transmission but the transmission can be performed based on the average high-precision transmission clock.

In the present embodiment as described above, since the second variable divider 131 is controlled by the control signal generating unit 170 during the time interval other than the transmission time interval, each transmission clock is brought to the free-running clock upon transmission. Since, however, the phase shift produced due to the frequency offset is compensated for the time interval other than the transmission time interval, the transmission can be performed using the average high-precision transmission clock.

Further, a means for measuring a frequency offset with any of the three frequency offset measuring means described in the first embodiment or other means and providing it as an initial value can also be adopted as a frequency offset measuring unit.

[Seventh Embodiment]

Figure 14:
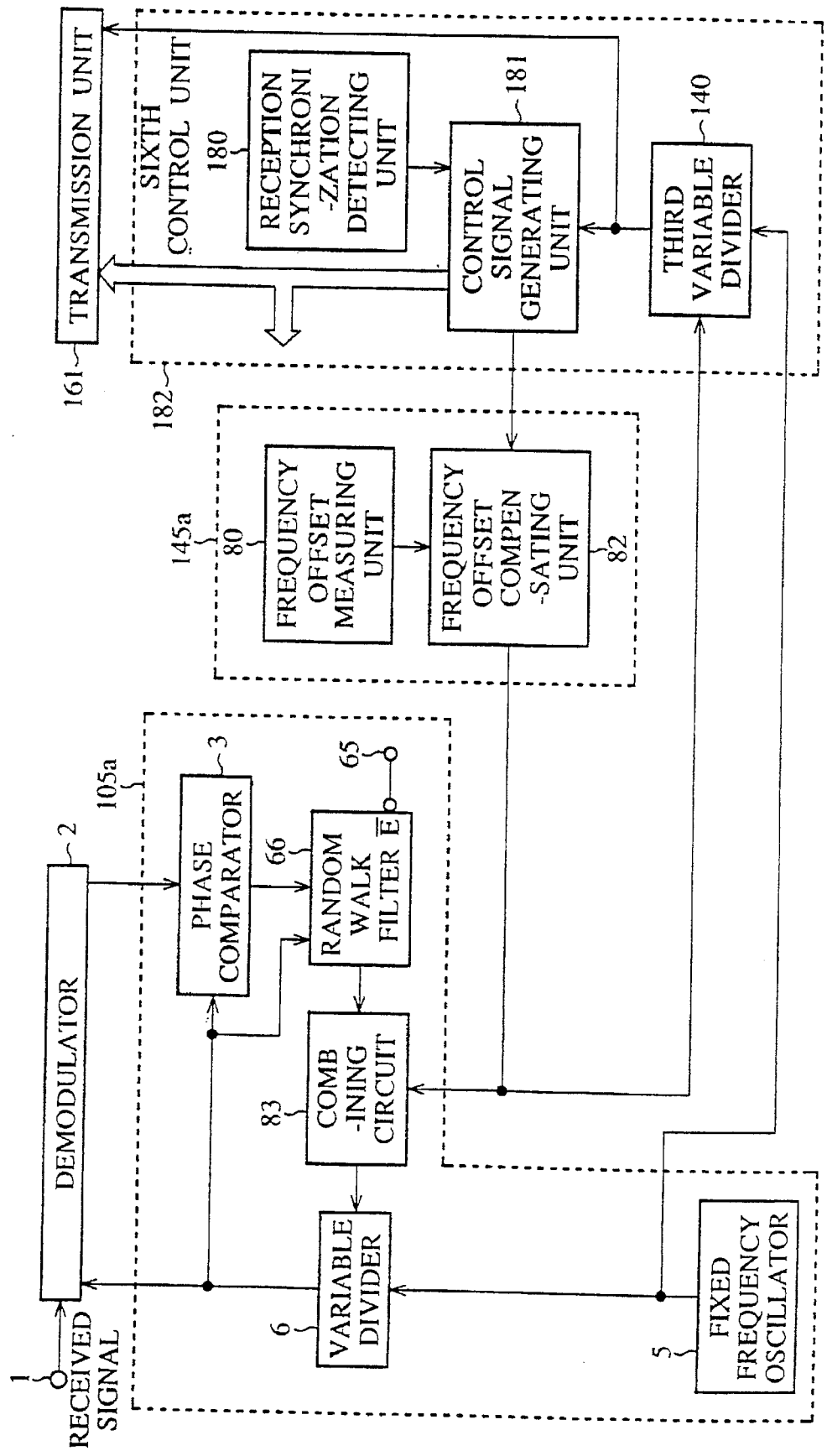
FIG. 14 is a block diagram illustrating a configuration of a seventh embodiment of the present invention.
Figure 16:
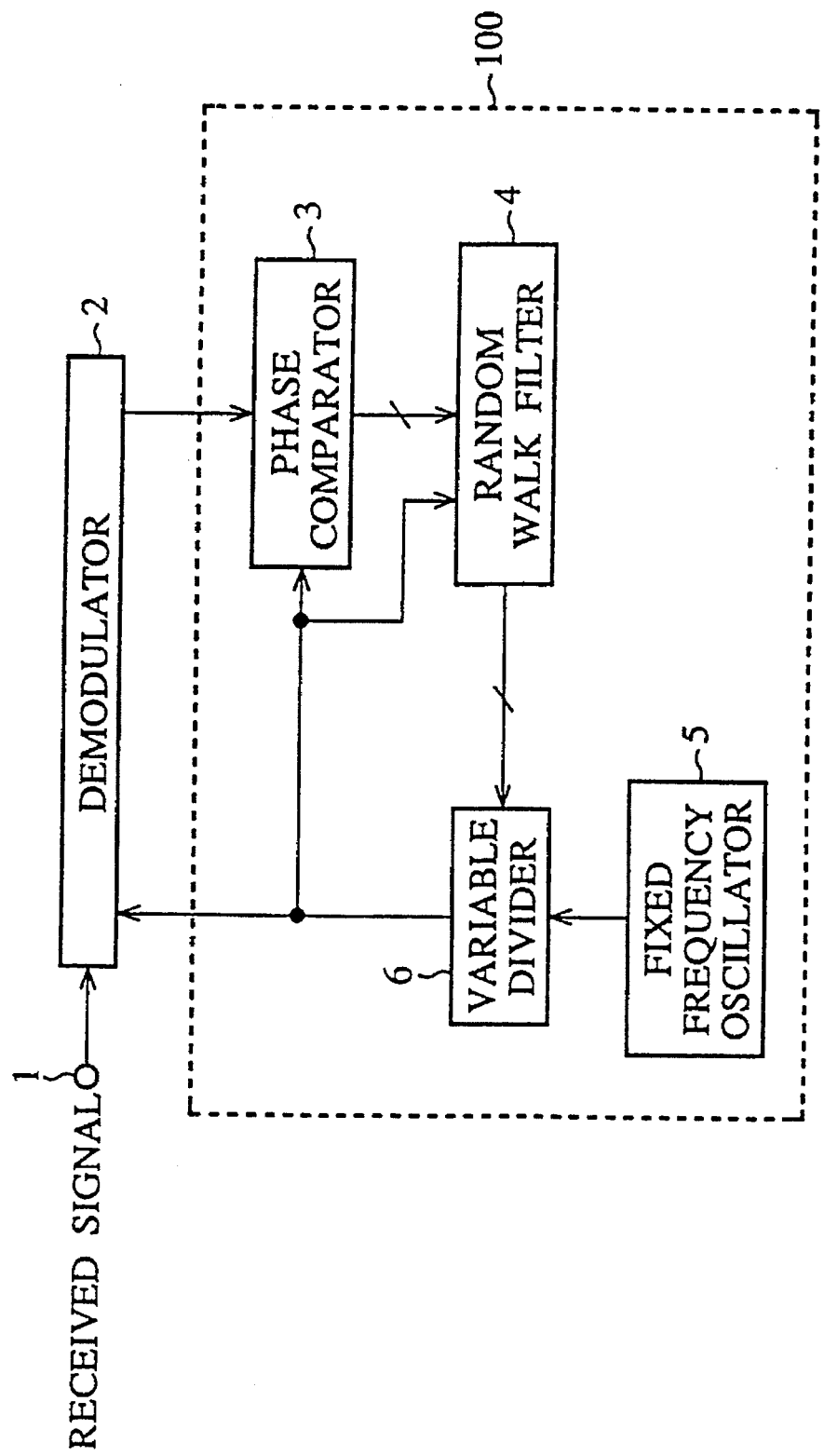
FIG. 16 is a block diagram showing a configuration of a conventional receiver.
Figure 17:
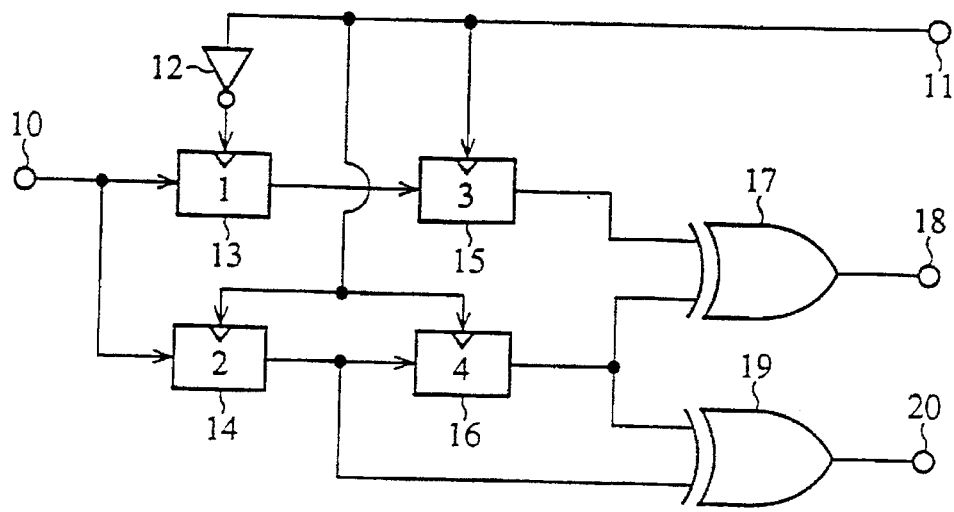
FIG. 17 is a block diagram illustrating a configuration of a phase comparator shown in FIG. 16.
Figure 18A:
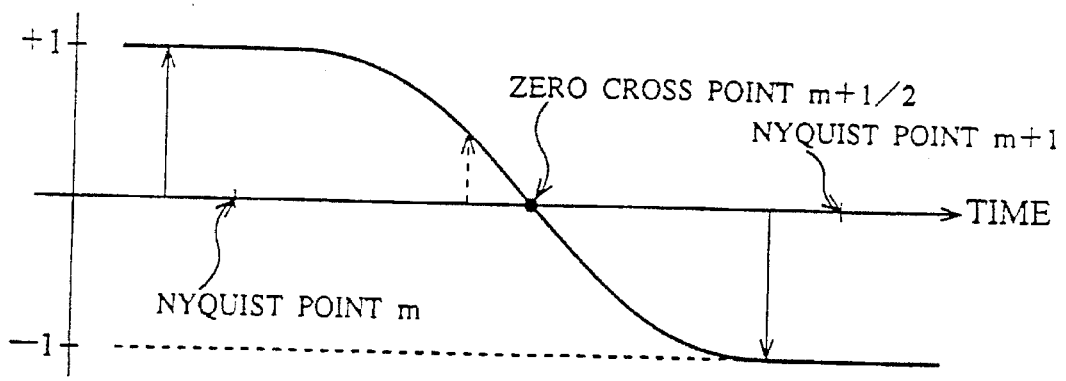
FIGS. 18(a) and 18(b) are respectively waveform charts for describing operations of the receiver shown in FIG. 16.
Figure 18B:
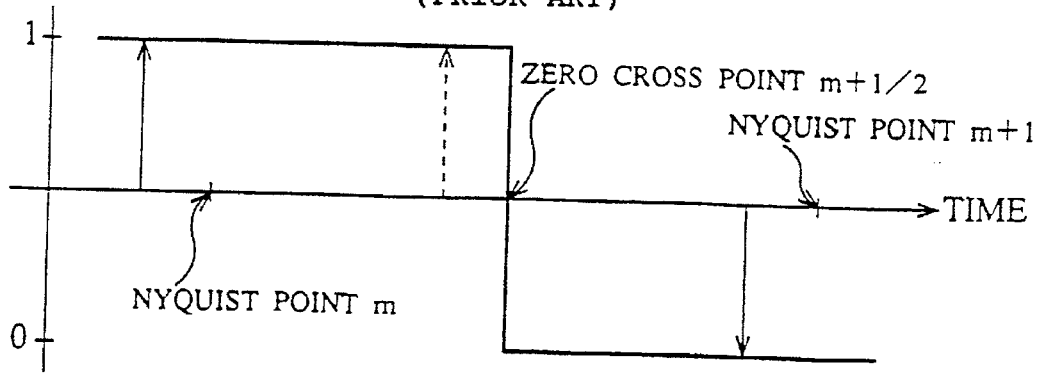
Figure 19:
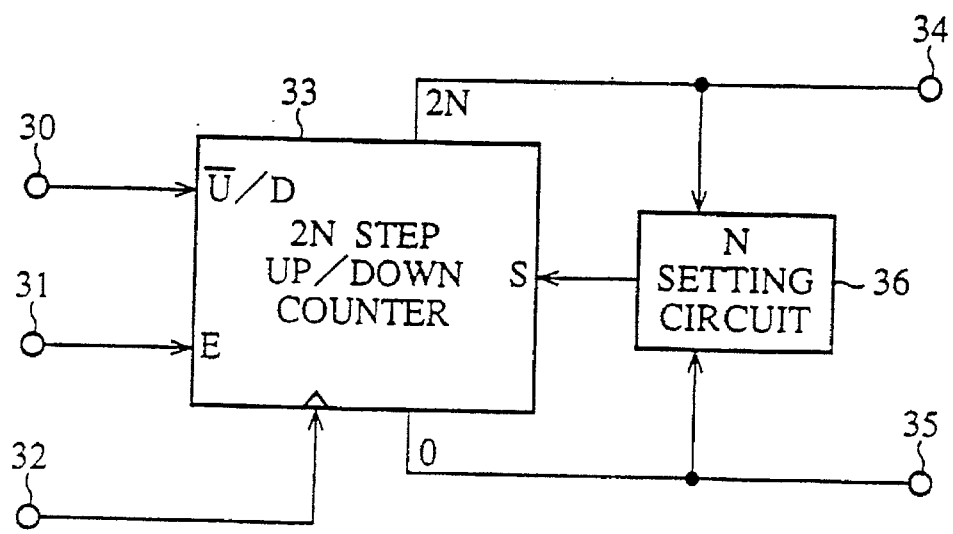
FIG. 19 is a block diagram showing a configuration of a random walk filter shown in FIG. 16.
Figure 20:
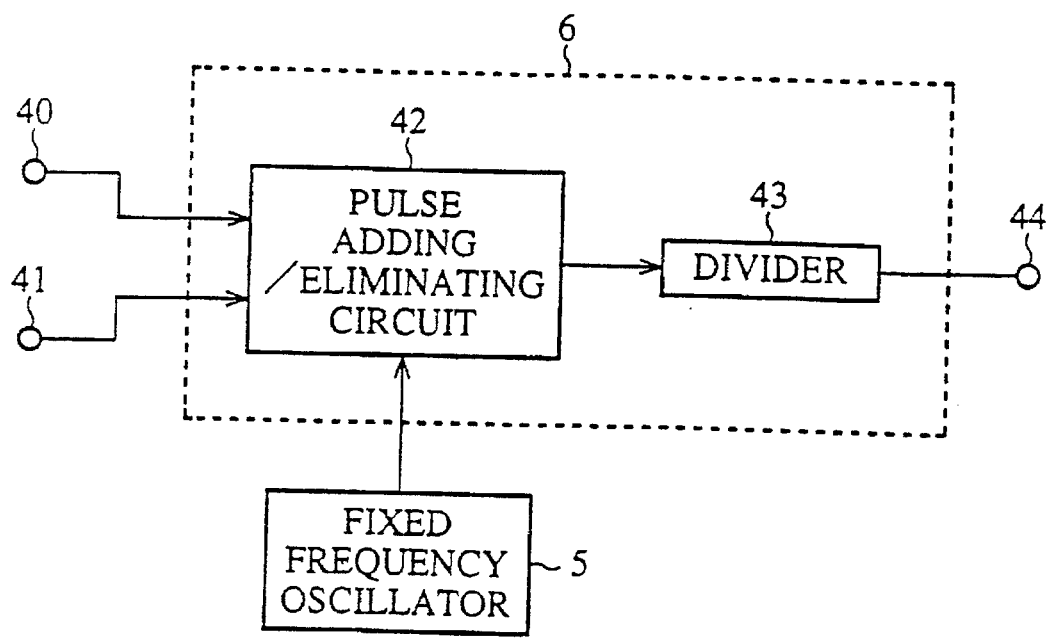
FIG. 20 is a block diagram illustrating a configuration of a variable divider shown in FIG. 16.
Figure 21:
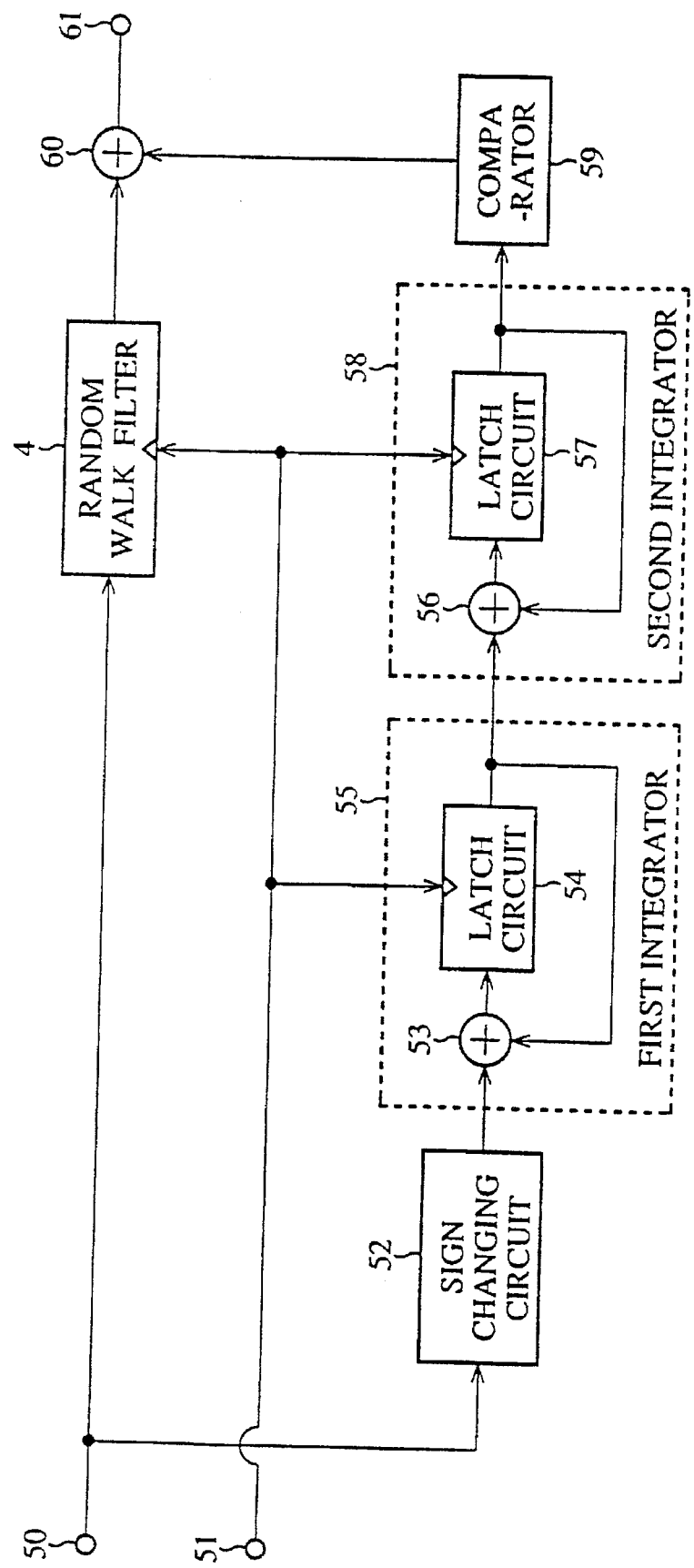
FIG. 21 is a view showing a configuration of a loop filter of a conventional secondary loop-type clock regenerating circuit.
Figure 22:
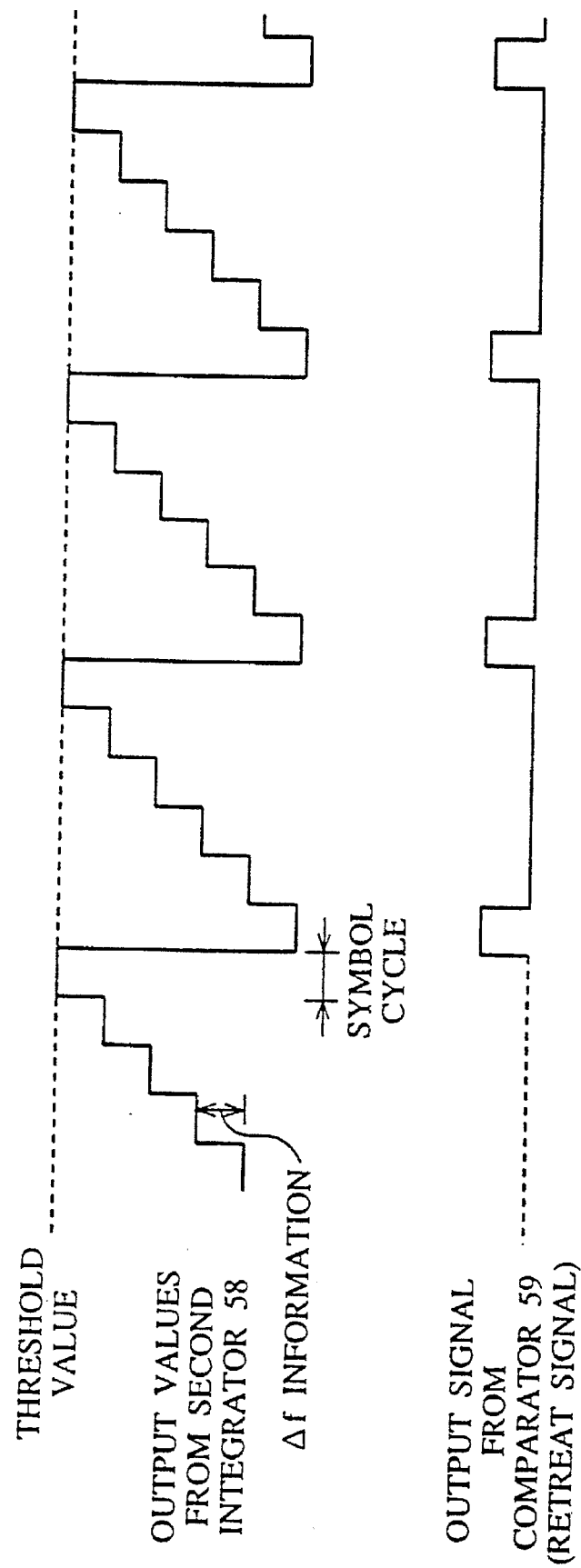
FIG. 22 is a view for describing the operation of each of a second integrator and a comparator both shown in FIG. 21.

FIG. 14 is a block diagram showing a configuration of a seventh embodiment of the present invention. In the drawing, the same elements as those shown in the conventional example and the aforementioned embodiments are identified by the same symbols.

In the present embodiment, a control signal for compensating a frequency offset is outputted with free-running timing before reception synchronization is made and is outputted during a time interval other than a transmission time interval after the reception synchronization has been made. As a result, compensation for a phase shift produced due to the frequency offset can be performed regardless of before or after the reception synchronization is made. Further, even when the control signal is in a free-running state during transmission, transmission using an average high-precision transmission clock can be carried out.

Referring to FIG. 14, reference numeral 180 indicates a reception synchronization detecting unit for detecting based on the result of detecting a synchronization code word or the like whether reception synchronization has been made. Reference numeral 181 indicates a control signal generating unit capable of varying timing for outputting each control signal used for compensation for a frequency offset in response to a signal outputted from the reception synchronization detecting unit with a clock outputted from a third variable divider 140 as a reference clock. Reference numeral 182 indicates a sixth control unit having the third variable divider 140, the reception synchronization detecting unit 180 and the control signal generating unit 181, for generating clocks for operating respective parts of a transmitter-receiver and control signals used for the transmitter-receiver so as to control timing.

The operation of the embodiment shown in FIG. 14 will now be described. A demodulator 2 continuously receives control signals as shown in FIG. 15(a) before reception synchronization is made. Since, at this time, frame timing or the like is unknown, the reception synchronization detecting unit 180 outputs a "non-synchronizing state" signal. The control signal generating unit 181 outputs a control signal for compensation for a frequency offset in a free-running state in response to the "non-synchronizing state" signal. A frequency offset compensating unit 82 outputs a "Retard/Advance" signal in response to the free-run control signal. Thus, even in the case of the "non-synchronizing state", a phase shift produced due to a clock frequency offset can be compensated.

When the reception synchronization is made based on the result of detecting a synchronization code word or the like, the reception synchronization detecting unit 180 outputs a "synchronizing state" signal therefrom. The control signal generating unit 181 outputs a control signal for compensation for a clock frequency offset during a time interval other than a transmission time interval in response to the "synchronizing state" signal to thereby compensate for a phase shift produced due to the frequency offset. Therefore, even when each control signal is in the free-running state during transmission, transmission using an average high-precision transmission clock can be performed.

In the present embodiment as described above, the phase shift produced due to the frequency offset can be compensated regardless of before or after the reception synchronization is made, by controlling the control signal for compensation for the frequency according to the reception synchronizing state. Even when the control signal is in the free-running state during transmission, the transmission can be made using the average high-precision transmission clock.

The same effect as described above can be obtained even where the gate signal inputted to the gate circuit 172 employed in the sixth embodiment shown in FIG. 13 is controlled according to the reception synchronizing state.

Further, a means for measuring a frequency offset with any of the three frequency offset measuring means described in the first embodiment or other means and providing it as an initial value may be adopted as a frequency offset measuring unit.

Having now fully described the invention, it will be apparent to those skilled in the art that many changes and modifications can be made without departing from the spirit or scope of the invention as set forth herein.

What is claimed is:

1. A receiver comprising:

demodulating means for demodulating a received signal;

clock recovery means constituting a phase-controlled loop including a variable divider for dividing a reference clock signal, for generating a clock phase-synchronized with a symbol clock component included in the received signal demodulated by said demodulating means;

frequency offset compensating means for controlling a division ratio of the variable divider so as to compensate for a frequency offset corresponding to a difference between a frequency of the symbol clock component included in the demodulated received signal and a free-running frequency of said clock recovery means; and wherein said compensation for the frequency offset is performed with operation timing different from that of said clock recovery means.

2. A receiver comprising:

demodulating means for demodulating a received signal;

clock recovery means constituting a phase-controlled loop including a variable divider for dividing a reference clock signal, for generating a clock phase-synchronized with a symbol clock component included in the received signal demodulated by said demodulating means;

frequency offset compensating means for controlling a division ratio of the variable divider so as to compensate for a frequency offset corresponding to a difference between a frequency of the symbol clock component included in the demodulated received signal and a free-running frequency of said clock recovery means; and wherein said compensation for the frequency offset is performed with operation timing corresponding to a frame pulse or a slot pulse.

3. A receiver comprising:

demodulating means for demodulating a received signal;

clock recovery means for generating a clock phase-synchronized with a symbol clock component included in the received signal demodulated by said demodulating means;

reference clock generating means including a variable divider, for dividing a frequency of a high-speed clock so as to produce a reference clock for said clock recovery means;

frequency offset compensating means for controlling a division ratio of the variable divider so as to compensate for a frequency offset corresponding to a difference between a frequency of the symbol clock component include in the demodulated received signal and a free-running frequency of said clock recovery means; and wherein said compensation for the frequency offset is performed with operation timing different from that of said clock recovery means.

4. A receiver comprising:

demodulating means for demodulating a received signal;

clock recovery means constituting a phase-controlled loop including a first variable divider, for generating a clock phase-synchronized with a symbol clock component included in the received signal demodulated by said demodulating means;

frequency offset compensating means for controlling a division ratio of the first variable divider so as to compensate for a frequency offset corresponding to a difference between a frequency of the symbol clock component included in the demodulated received signal and a free-running frequency of said clock recovery means with operation timing different from that of said clock recovery means; and control means having a second variable divider, for receiving a reference clock of said clock recovery means therein, for controlling and compensating a variable division ratio of the second variable divider based on frequency offset information of said frequency offset compensating means and for generating clocks for operating respective parts in said receiver and other devices concerned therewith and signals for controlling them.

5. A receiver comprising:

demodulating means for demodulating a received signal;

clock recovery means for generating a clock phase-synchronized with a symbol clock component included in the received signal demodulated by said demodulating means;

reference clock generating means including a variable divider, for variably dividing a frequency of a high-speed clock so as to produce a reference clock for said clock recovery means;

frequency offset compensating means for controlling a division ratio of the variable divider so as to compensate for a frequency offset corresponding to a difference between a frequency of the symbol clock component included in the demodulated received signal and a free-running frequency of said clock recovery means with operation timing different from that of said clock recovery means; and control means for receiving therein the reference clock whose frequency offset is compensated, from said clock recovery means so as to generate clocks for operating respective parts in said receiver and other devices concerned therewith and signals for controlling them.

6. A transmitter-receiver comprising:

demodulating means for demodulating a received signal;

clock recovery means constituting a phase-controlled loop including a first variable divider, for generating a clock phase-synchronized with a symbol clock component included in the received signal demodulated by said demodulating means;

frequency offset compensating means for controlling a division ratio of the first variable divider so as to compensate for a frequency offset corresponding to a difference between a frequency of the symbol clock component included in the demodulated received signal and a free-running frequency of said clock recovery means with operation timing different from that of said clock recovery means;

control means having a second variable divider, for receiving a reference clock of said clock recovery means therein, controlling and compensating a division ratio of the second variable divider based on frequency offset information of said frequency offset compensating means and generating clocks for operating respective parts in said transmitter-receiver and other devices concerned therewith and signals for controlling them; and wherein said compensation for the frequency offset is performed based on transmission timing information of said control means during a time interval other than a transmission time interval.

7. A transmitter-receiver comprising:

demodulating means for demodulating a received signal;

clock recovery means for generating a clock phase-synchronized with a symbol clock component included in the received signal demodulated by said demodulating means;

reference clock generating means including a variable divider, for dividing a frequency of a high-speed clock so as to produce a reference clock for said clock recovery means;

frequency offset compensating means for controlling a division ratio of the variable divider so as to compensate for a frequency offset corresponding to a difference between a frequency of the symbol clock component included in the demodulated received signal and a free-running frequency of said clock recovery means with operation timing different from that of said clock recovery means;

control means for receiving therein the reference clock whose frequency offset is compensated, from said clock recovery means so as to generate clocks for operating respective parts in said transmitter-receiver and other devices concerned therewith and signals for controlling them; and wherein said compensation for the frequency offset is performed based on transmission timing information of said control means during a time interval other than a transmission time interval.

8. A transmitter-receiver comprising:

demodulating means for demodulating a received signal;

clock recovery means constituting a phase-controlled loop including a first variable divider, for generating a clock phase-synchronized with a symbol clock component included in the received signal demodulated by said demodulating means;

frequency offset compensating means for controlling a division ratio of the first variable divider so as to compensate for a frequency offset corresponding to a difference between a frequency of the symbol clock component included in the demodulated received signal and a free-running frequency of said clock recovery means with operation timing different from that of said clock recovery means;

control means having a second variable divider, for receiving a reference clock of said clock recovery means therein, controlling and compensating a division ratio of the second variable divider based on frequency offset information of said frequency offset compensating means and generating clocks for operating respective parts in said transmitter-receiver and other devices concerned therewith and signals for controlling them; and wherein said compensation for the frequency offset is performed with free-running timing until reception synchronization is made and being performed during a time interval other than a transmission time interval after the reception synchronization has been made.

9. A communication device comprising:

a demodulator;

a clock recovery circuit, said clock recovery circuit receiving a demodulated signal from said demodulator and generating a clock which is phase-synchronized with a symbol clock component included in the demodulated signal;

a frequency offset measuring unit, said measuring unit generating frequency offset information comprising the difference between a frequency component of said symbol clock component and a free-running frequency of said clock recovery circuit;

a frequency offset compensating unit, said compensating unit sending one of an advance signal and a retard signal to said clock recovery circuit in response to frequency offset information sent from said measuring unit.

10. A communications device according to claim 9, said compensating unit comprising a numeric value converting unit which receives said frequency offset information, an integrator, and a signal generating unit.

11. A communications device according to claim 9, said device further comprising a control unit which generates clocks for operating respective parts of said device in order to control timing.

12. A communications device according to claim 9, said measuring unit comprising an up/down counter, a latch circuit which receives an output from said up/down counter, and an averaging circuit which averages values received from said latch circuit and generates said frequency offset information.

13. A communications device according to claim 9, said measuring unit comprising a high precision oscillator, a frequency counter which counts a frequency of a fixed frequency oscillator contained in said clock recovery circuit on the basis of the output of the high precision oscillator, and a frequency offset calculating unit which receives an output of said frequency counter and generates said frequency offset information.

14. A communications device according to claim 9, said clock recovery circuit comprising a reference clock generator comprising a high speed fixed frequency oscillator and a variable divider, said variable divider frequency dividing a clock outputted from the high speed fixed oscillator in accordance with a division ratio based on the signal sent from said frequency offset compensating unit.

15. A communications device according to claim 11, wherein said device is a receiver and said control unit comprises a variable divider which receives as input the signal sent from said frequency offset compensating unit and an output of a fixed frequency oscillator of the clock recovery circuit; and a control signal generating unit which receives the output of said variable divider.

16. A communications device according to claim 14, wherein said device is a receiver and further comprises a control unit which receives a reference clock generated by said reference clock generator, said control unit comprising a clock generating unit which generates a clock for operating respective parts of the receiver and parts connected therewith in order to control timing.

17. A communications device according to claim 15, wherein said device is also a transmitter and further comprises a transmission unit which receives said output of said variable divider and control signals from said control signal generating unit.

18. A communications device according to claim 16, wherein said device is also a transmitter and further comprises a control signal generating unit for generating clocks based on the clock outputted by said clock generating unit for operating respective parts of said device in order to control timing; and a transmission unit which receives said clock from said clock generating unit and control signals from said control signal generating unit.

19. A communications device according to claim 17, said control unit further comprising a reception synchronization detecting unit which sends one of a synchronized state or non-synchronized state signal to said control signal generating unit.

20. A method of compensating for frequency offset in a communications system, comprising the steps of:

demodulating a received signal;

generating a clock which is phase-synchronized with a symbol clock component included in the demodulated signal;

measuring frequency offset information comprising the difference between a frequency component of said symbol clock component and a free-running frequency of a clock recovery circuit utilized in said generating step;

sending one of an advance signal and a retard signal to said clock recovery circuit in response to frequency offset information sent from said measuring unit.

21. A method according to claim 20, further comprising generating clocks for operating respective parts of said communications system in order to control timing.

22. A method according to claim 20, said measuring step further comprising obtaining said frequency offset information stored in said clock recovery circuit.

23. A method according to claim 20, said generating step further comprising generating a reference clock by frequency dividing a clock outputted from an oscillator in accordance with a division ratio based on the signal sent during said sending step.

24. A method according to claim 21, said generating clocks step further comprises frequency dividing one of an advanced signal and a retard signal sent during said sending step.

25. A method according to claim 23, further comprising generating a second clock based on said reference clock, in order to operate respective parts of said communications system in order to control timing.

26. A method according to claim 24, said generating clocks step further comprising sending one of a synchronization state signal or non-synchronization state signal.

* * * * *

UNITED STATES PATENT AND TRADEMARK OFFICE
CERTIFICATE OF CORRECTION

PATENT NO. : 5,661,765
DATED : August 26, 1997
INVENTOR(S): Fumio Ishizu

It is certified that error appears in the above-identified patent and that said Letters Patent is hereby corrected as shown below:

In FIG. 5, block 66 change "pilter" to -- filter --.

Signed and Sealed this

Twenty-seventh Day of January, 1998

Attest:

BRUCE LEHMAN

Attesting Officer

Commissioner of Patents and Trademarks